(12) United States Patent
Nakayama et al.

(10) Patent No.: US 7,459,338 B2
(45) Date of Patent: Dec. 2, 2008

(54) SUBSTRATE, CONDUCTIVE SUBSTRATE, FINE STRUCTURE SUBSTRATE, ORGANIC FIELD EFFECT TRANSISTOR AND MANUFACTURING METHOD THEREOF

(75) Inventors: Tomonari Nakayama, Yokohama (JP);
Toshinobu Ohnishi, Yokohama (JP);
Makoto Kubota, Kawasaki (JP);
Daisuke Miura, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 11/077,931

(22) Filed: Mar. 11, 2005

(65) Prior Publication Data
US 2005/0202348 A1 Sep. 15, 2005

(30) Foreign Application Priority Data

| Mar. 11, 2004 | (JP) | ............................. 2004-069082 |
| Mar. 11, 2004 | (JP) | ............................. 2004-069083 |
| Mar. 8, 2005 | (JP) | ............................. 2005-064562 |

(51) Int. Cl.
*H01L 51/40* (2006.01)
(52) U.S. Cl. .......................................... 438/99; 257/40
(58) Field of Classification Search ................... 257/40; 438/99
See application file for complete search history.

(56) References Cited

U.S. PATENT DOCUMENTS

| 6,228,228 | B1 * | 5/2001 | Singh et al. ............... 204/192.1 |
| 6,515,314 | B1 * | 2/2003 | Duggal et al. ................ 257/184 |
| 6,919,158 | B2 | 7/2005 | Kawamura et al. ........ 430/270.1 |
| 2001/0030059 | A1 * | 10/2001 | Sugaya et al. ............... 174/256 |
| 2002/0038997 | A1 * | 4/2002 | Sakai et al. .................. 313/495 |
| 2003/0035948 | A1 * | 2/2003 | Fujimaru et al. ............. 428/343 |
| 2003/0071567 | A1 * | 4/2003 | Eida et al. .................... 313/504 |
| 2004/0118520 | A1 | 6/2004 | Nakayama et al. ...... 156/345.41 |
| 2004/0129937 | A1 * | 7/2004 | Hirai ............................ 257/40 |
| 2004/0152230 | A1 | 8/2004 | Kubota et al. ................. 438/99 |
| 2004/0238816 | A1 * | 12/2004 | Tano et al. .................... 257/40 |
| 2004/0263739 | A1 * | 12/2004 | Sirringhaus et al. ......... 349/135 |
| 2005/0009327 | A1 * | 1/2005 | Yoshida et al. .............. 438/661 |

(Continued)

FOREIGN PATENT DOCUMENTS

JP 11-12376 1/1999

(Continued)

OTHER PUBLICATIONS

C. D. Dimitrakopoulos, et al.; "Organic Thin Film Transistors for Large Area Electronics", Advanced Materials, vol. 14, No. 2, Jan. 16, 2002, pp. 99-117.

*Primary Examiner*—Jerome Jackson, Jr.
*Assistant Examiner*—Anthony Ho
(74) *Attorney, Agent, or Firm*—Fitzpatrick, Cella, Harper & Scinto

(57) ABSTRACT

A substrate is provided which comprises an organic resin layer on a base material, wherein the base material has an average surface roughness of not less than 1.2 nm but no more than 5 nm and a maximum height of a surface unevenness of not less than 0.1 μm but no more than 1.0 μm; the organic resin layer has an average surface roughness of not more than 1 nm and a maximum peak height of a surface unevenness of not more than 30 nm; and at least a part of a surface of the organic resin layer comprises a hydrophilic region.

9 Claims, 12 Drawing Sheets

U.S. PATENT DOCUMENTS

2005/0194588 A1 * 9/2005 Sasaki et al. .................. 257/40

FOREIGN PATENT DOCUMENTS

| JP | 2002-169303 | | 6/2002 |
|---|---|---|---|
| JP | 2003-59940 | | 2/2003 |
| JP | 2003-059940 | * | 2/2003 |
| JP | 2003-76004 | | 3/2003 |
| WO | WO 03/007398 A1 | * | 1/2003 |

* cited by examiner

SUBSTRATE, CONDUCTIVE SUBSTRATE, FINE STRUCTURE SUBSTRATE, ORGANIC FIELD EFFECT TRANSISTOR AND MANUFACTURING METHOD THEREOF

BACKGROUND OF THE INVENTION

1. Field of the Invention

The present invention relates to a substrate, a conductive substrate, a fine structure substrate, an organic field effect transistor and a method of manufacturing them, in particular to a substrate, a conductive substrate and a method of manufacturing them in which variously applicable layers such as electrodes, metal wiring, insulating layers, and fine patterns of these layers can be formed on a base material having an unevenness such as resin material and in particular to a substrate, a conductive substrate, a fine structure substrate, an organic field effect transistor, and a method of manufacturing them in which a flat and smooth layer can be provided by a simple method such as coating on an inexpensive base material to form layers such as electrodes, metal wiring and an insulating layer easily with good adhesion and which can be used for making fine elements such as semiconductor elements, integrated circuits, image display device and the like.

2. Related Background Art

In recent years, under the situation that compactness, thinness and portability of electronic devices are given importance, attention is being paid to electronic parts in which thin and flexible base material such as resin material are used. At the same time, finer structure, higher density, high reliability, cost reduction are also being required, thus substrates appropriate for manufacturing electronic parts are becoming indispensable. In addition, a fine structure substrate having a fine structure such as metal wiring formed on a resin substrate is being highly desired.

Furthermore, since the latter half of the 1980s, field effect transistors using organic semiconductor materials have gradually been developed actively, and have entered such a stage as to surpass the characteristics of thin-film transistors of amorphous silicon as basic performance. Because organic materials can easily be processed and generally have a high affinity to plastic substrates for formation of thin film FETs (Field Effect Transistors), and therefore because organic materials enable manufacturers to adopt low-temperature processing, transistors can be formed so as to have a large area at low cost with a simple process by use of manufacturing methods such as coating and printing. Drive circuits for thin film displays and electronic papers, radio frequency identification (RFID) tag and IC cards and the like are being assumed for application and development, and there exist a number of technical reviews (for example, C. D. Dimitrakopoulos et. al, "Organic Thin Film Transistors for Large Area Electronics," Advanced Material, 14, 2002, No. 2, P. 99-117).

In particular, organic field effect transistors on resin substrates have all the foregoing advantages and are industrially very useful. Accordingly, provision of organic field effect transistors having a fine structure such as a metal wiring or insulator formed on a resin substrate are highly desired.

Hitherto, for example, in the case of manufacturing electric/electronic circuit substrates such as semiconductor integrated circuits (IC) or electronic parts such as capacitors for DRAMs, as a method of forming a fine structure at a predetermined part on a substrate, the method has been known in which a layer is prepared on a substrate by means of a gas phase method such as evaporation, chemical vapor deposition (CVD), sputtering, or a coating method using sol-gel process or the like, a pattern is formed using photolithography, and thereafter unnecessary portions are removed.

However, in the case of forming a fine structure substrate by means of the photolithography, a vacuum apparatus for evaporation, sputtering, etc., is used to form a thin film, which is then pattered to produce a device. In general, with the photolithography, patterning is effected through the following steps. At first, a thin film to be patterned is formed entirely on a surface of a substrate. Moreover, resist coating, exposure, development, rinsing and so on are performed to form a resist pattern. Thereafter, the resist pattern is used as a mask to effect etching to remove an unnecessary portion to provide to a desired pattern shape. As described above, the photolithography method requires very large number of steps. Therefore, the photolithography method is costly.

On the other hand, as methods of forming electrodes on electric/electronic circuit substrates such as semiconductor integrated circuit (IC) or the like, simple methods has become available which utilizes an ink jet method or a coating method such as screen printing or offset printing using metal fine powder-dispersed paste or slurry. It is expected that this will enable metal electrodes to be formed without using a complicated method such as plating, vacuum evaporation, sputtering, etc., or a costly method such as photolithography method and the like.

However, in the case of a printing method such as screen printing, for example, formation of a fine pattern with a line width of 10 μm or less entails difficulties. The reason is that the processing accuracy of the mask is reflected to the pattern accuracy.

On the other hand, such printable electrode material is becoming capable of obtaining a high conductivity similar to that of an evaporated metal film, which poses the large problem that a calcination temperature of 150° C. or more will be required in order to attain such a high conductivity. Therefore, the heat resistance of the substrate material or substrate is nonnegligible. Polyethylene terephthalate (PET) film, which is the most general-purpose resin base material at present, is inferior in terms of heat resistance and is therefore difficult to be used when heated, e.g., to 150° C. or more. On the other hand, polyethylene naphthalate (PEN) and polyimide base materials withstand heating up to about 200° C. but is expensive compared with PET.

In addition, in the case of forming an electrode pattern using liquid through printing or the like, the surface state of the base material affects the characteristics of the obtained film, which results in the possibility that no desired conductivity may be obtained or necessitates that the film is made thicker than needed. The surface state of the base material includes, for example, the flatness and smoothness of the surface. Although a resin base material formed in a seat shape has the advantages of high processability and deformability as well as inexpensiveness, a number of steps or unevennesses generated at the time of forming are recognizable and the surface flatness and smoothness are inferior to those of glass or silicon base material, which has been a problem. In the case where a solution was coated on such resin base material surface with the aid of a bar coater and dipping, uniform coating has been difficult. The film characteristics after the calcination have not also been uniform.

Further, in a conductive ink or the like, the wettability will vary largely depending on the state of the base material surface. In particular, in case of a water dispersion, on a base material having a large water contact angle, there is a possibility that shedding may occur, or the uniformity of film thickness may remarkably lower, or particles in the dispersion may aggregate. Moreover, also in case of using pastes to form a pattern, the pattern shape and the resolution is largely affected by the unevenness or wettability of the base material surface.

The wettability of the base material surface can be improved with a variety of surface modification methods. Those methods include chemical treatment methods using chemical agents or coupling agents and physical treatment methods including ultraviolet radiation and plasma contact, etc. The former chemical treatment method is exemplified by a method of immersing a base material in sulfuric acid to make the surface hydrophilic, which, however, may cause a serious damage depending on the kind of the base material and necessitates post-treatment cleaning. On the other hand, the ultraviolet radiation and plasma treatment have been known to have an effect of making hydrophilic a variety of resin base materials including fluororesin base materials and improve the adhesion. However, because the effect of surface modification by the treatment will vary depending on the kinds of base materials, the applicable base materials are limited, which has been a problem.

Under the above circumstances, an example has been reported in which a hydrophilic polymer thin film is formed on a base material to effect surface modification. In this example, a thin film of a polymer containing a hydrophilic group such as sulfonic acid is used. Because the polymer thin film is fixed on the substrate material, irradiation with ionizing radiation is required. When a thick film is to be obtained or the fixing operation is omitted, there has been a possibility that swelling may occur at the time of the immersion in water (Japanese Patent Application Laid-Open No. H11-12376).

On the other hand, another example has been reported in which a hydrophobic film such as a silane derivative is formed on a substrate and irradiated with light through a photomask to form a hydrophilic latent image, and a metal oxide such as $TiO_2$ is deposited on this hydrophilic latent image by sol-gel process or the like, thereby forming a pattern (for example, Japanese Patent Application Laid-Open No. 2002-169303). Because $TiO_2$ will not grow on the hydrophobic film, a fine pattern can be obtained. However, although the film formation of $TiO_2$ is performed at ordinary temperature, long-time ultraviolet irradiation is required in order to decrease the water contact angle to lengthen the manufacturing time, so that much cost reduction cannot not be accomplished.

Moreover, still another example has been reported in which polarities on a substrate are controlled to form a pattern. In this method, a metal oxide such as $TiO_2$, which gives rise to light polarity change, is formed on a substrate surface and irradiated with light through a photomask to form a latent image, and an ink is deposited on this latent image using an ink jet drawing method to form a pattern (for example, Japanese Patent Application Laid-Open No. 2003-59940).

Because a resin substrate surface have many bumps with heights of about 200 nm, in order to fill these bumps, a film of not less than 2 μm in thickness needs to be formed on the resin substrate. However, because in general a metal oxide cannot be formed into a film in a thickness of a micrometer order and the bumps of the resin substrate cannot therefore be filled, no resin substrate of good smoothness will not be obtained. Moreover, the obtained pattern will suffer from blurring (staining), so that no fine pattern can be obtained. In addition, in the method, the metal oxide is formed into a film by use of the evaporation or the sol-gel process. In the case of the evaporation, migration may occur between the film and the resin substrate or the resin substrate may deform. In the case of the sol-gel process, in order to obtain an anatase-type crystal with good photosensitivity, a high-temperature calcination above 200° C. is required, giving rise to the above-mentioned problem of unemployability of PET or the like, accompanied by the problem that the available resin substrates are limited.

Yet another example has been reported in which such metal oxides are not used and substrate polarity change is utilized. With this method, a polymer compound susceptible to polarity change is grown by graft polymerization on a resin substrate subjected to reaction activation treatment or roughening treatment (for example, Japanese Patent Application Laid-Open No. 2003-76004). In this case, although the polymer compound can be grown at a low temperature, the resin substrate surface is rough, so that no fine pattern can be formed, which is a problem.

In addition, in these organic field effect transistors, a gate electrode is formed on an organic semiconductor layer. In general, a surface of an organic semiconductor material will be discomposed with UV light or the like, and therefore in the case of such stacking order, changing the surface energy by use of UV light may result in lowering in the performance. In addition, because source and drain electrodes are formed on a substrate, an insulating film on the source and drain electrodes will be thin, thereby posing the problem that a leak current is apt to be generated.

As described above, in the case of forming layers such as electrodes on a general-purpose resin base material, the existence of unevenness on the base material has resulted in difficulty in forming a desired layer such as electrode with a low resistance and uniform characteristics by use of a dispersion liquid or paste of conductive fine particles.

SUMMARY OF THE INVENTION

The present invention has been accomplished in view of the prior art, and it is, therefore, an object of the present invention to provide a substrate, an organic field effect transistor and a manufacturing method thereof in which a desired layer can be formed even on a base material having much unevenness or many protuberances on a surface thereof such as a resin base material.

In addition, it is another object of the present invention to provide a fine structures substrate having a precise and fine pattern formed on a resin substrate and an organic field effect transistor using the same.

Moreover, it is still another object of the present invention to provide a method of manufacturing the substrate and organic field effect transistor easily without need of complicated steps or an expensive equipment.

According to a first aspect of the present invention, there is provided a substrate comprising an organic resin layer on a base material, wherein the base material has an average surface roughness of not less than 1.2 nm but no more than 5 nm and a maximum height of a surface unevenness of not less than 0.1 μm but no more than 1.0 μm; the organic resin layer has an average surface roughness of not more than 1 nm and a maximum peak height of a surface unevenness of not more than 30 nm; and at least a part of a surface of the organic resin layer comprises a hydrophilic region.

In the substrate in accordance with the present invention, it is preferred that the organic resin layer has a film thickness of 1 to 10 μm.

Further, it is preferred that the organic resin layer has a thermal deformation temperature of not less than 130° C.

Moreover, it is preferred that the organic resin layer comprises phenolic resin.

Further, it is preferred that the base material is a resin base material.

Moreover, it is preferred that the organic resin layer has a surface resistivity of not less than $1.0 \times 10^{12}$ Ω/□.

Further, it is preferred that the hydrophilic region has a water contact angle of 5 to 55°.

According to a second aspect of the present invention, there is provided a conductive substrate comprising a conductive layer provided in the hydrophilic region of the above-mentioned substrate.

In the conductive substrate in accordance with the present invention, it is preferred that the conductive layer comprises conductive fine particles of an average particle diameter of 10 nm to 2 μm.

According to a third aspect of the present invention, there is provided a method of manufacturing a substrate, comprising the steps of applying an organic resin solution to a base material having an average surface roughness of not less than 1.2 nm but no more than 5 nm and a maximum height of a surface unevenness of not less than 0.1 μm but no more than 1.0 μm and then effecting heating to form an organic resin layer having an average surface roughness of not more than 1 nm and a maximum peak height of a surface unevenness of not more than 30 nm; and subjecting the organic resin layer to ultraviolet irradiation, electron beam irradiation, corona discharge, or ozone treatment to form a hydrophilic region in at least a part of a surface of the organic resin layer.

In the method of manufacturing a substrate in accordance with the present invention, it is preferred that the ultraviolet irradiation, electron beam irradiation, corona discharge, or ozone treatment is effected so as to adjust the water contact angle of the hydrophilic region within the range of 5 to 55°.

According to a fourth aspect of the present invention, there is provided a method of manufacturing a conductive substrate, comprising the steps of applying an organic resin solution to a base material having an average surface roughness of not less than 1.2 nm but no more than 5 nm and a maximum height of a surface unevenness of not less than 0.1 μm but no more than 1.0 μm and then effecting heating to form an organic resin layer having an average surface roughness of not more than 1 nm and a maximum peak height of a surface unevenness of not more than 30 nm; subjecting the organic resin layer to ultraviolet irradiation, electron beam irradiation, corona discharge, or ozone treatment to form a hydrophilic region in at least a part of a surface of the organic resin layer; and forming a conductive layer in the hydrophilic region.

In the method of manufacturing a conductive substrate in accordance with the present invention, it is preferred that the step of forming the conductive layer comprises application of a solution having conductive fine particles of a diameter of 10 nm to 2 μm dispersed or dissolved in water or alcohol, followed by heating.

According to a fifth aspect of the present invention, there is provided a fine structure substrate, comprising a base material having an average surface roughness of less than 1.2 nm but no more than 5 nm and a maximum peak height of a surface unevenness of not less than 0.1 μm but no more than 1.0 μm, an organic layer provided on the base material and having a surface roughness of not more than 1 nm and a maximum peak height of a surface unevenness of not more than 30 nm, and a hydrophobic organic layer provided on the organic layer, wherein at least a part of the hydrophobic organic layer is made hydrophilic to form a hydrophilic portion and a fine structure is formed in the hydrophilic portion.

In the fine structure substrate in accordance with the present invention, it is preferred that the base material is a resin base material.

Further, it is preferred that the organic layer comprises a curable (or hardening) resin.

Moreover, it is preferred that the hydrophobic organic layer comprises a polymeric material containing at least a fluoroalkyl group.

Further, it is preferred that the fine structure comprises a pattern formed of a conductive material or an insulating material.

According to a sixth aspect of the present invention, there is provided a method of manufacturing a fine structure substrate, comprising the steps of applying an organic resin solution to a base material having an average surface roughness of not less than 1.2 nm but no more than 5 nm and a maximum height of a surface unevenness of not less than 0.1 μm but no more than 1.0 μm and then effecting heating to form an organic layer having an average surface roughness of not more than 1 nm and a maximum peak height of a surface unevenness of not more than 30 nm; forming a hydrophobic organic layer on the organic layer; subjecting at least a part of the hydrophobic organic layer to a hydrophilizing treatment to form a hydrophilic portion; and forming a fine structure in the hydrophilic portion.

In the method of manufacturing a fine structure substrate in accordance with the present invention, it is preferred that the hydrophilic portion has a water contact angle of not less than 5° but no more than 55°.

Further, it is preferred that the hydrophobic organic layer has a water contact angle of not less than 80° but no more than 130°.

Moreover, it is preferred that the hydrophilic portion and the hydrophobic organic layer differ from each other in water contact angle by 30° to 110°.

Further, it is preferred that the hydrophilizing treatment is at least one selected from ultraviolet irradiation, ozone treatment, corona treatment, electron beam irradiation, and plasma treatment.

Moreover, it is preferred that the ultraviolet light used for the hydrophilizing treatment has a wavelength of not less than 150 nm but no more than 350 nm.

Further, it is preferred that the step of forming a fine structure in the hydrophilic portion comprises applying a conductive or insulating material by dip coating to the hydrophilic portion to form a pattern.

Moreover, it is preferred that the step of forming a fine structure in the hydrophilic portion comprises applying a conductive or insulating material by an ink jet method to the hydrophilic portion to form a pattern.

According to a seventh aspect of the present invention, there is provided a substrate having on a resin base material a flattening layer comprising an organic resin.

In the substrate in accordance with the present invention, it is preferred that an average surface roughness of the resin base material at an interface with the flattening layer is not less than 1.2 nm but no more than 5 nm and an average surface roughness of a surface opposite to the resin base material of the flattening layer is not more than 1 nm.

Further, it is preferred that at least a part of a surface opposite to the resin base material of the flattening layer comprises a hydrophilic region.

Moreover, it is preferred that a part of a surface opposite to the resin base material of the flattening layer and the other part of the opposite surface differ in hydrophilicity from each other.

Further, it is preferred that a part of a surface opposite to the resin base material of the flattening layer and the other part of the opposite surface differ in surface energy from each other.

Moreover, it is preferred that a part of a surface opposite to the resin base material of the flattening layer comprises a hydrophilic region and the other part of the opposite surface has a hydrophobic region.

Further, it is preferred that a conductive member is provided in the hydrophilic region.

Moreover, it is preferred that the flattening layer comprises two or more organic resin layers.

According to an eighth aspect of the present invention, there is provided an organic field effect transistor comprising on the above-mentioned substrate, a gate electrode, a gate insulating film, a source electrode, a drain electrode, and an organic semiconductor layer.

According to a ninth aspect of the present invention, there is provided a method of manufacturing an organic field effect transistor comprising a resin substrate, a gate electrode, a gate insulating layer, a source electrode, a drain electrode, and an organic semiconductor layer, the method comprising the steps of forming a flattening layer by application on at least a resin substrate; subjecting the flattening layer to such a treatment as to form, in a surface of the flattening layer, a first region and a second region having different surface free energies; forming a gate electrode by application on only either one of the first and the second regions; forming a gate insulating layer by application on the gate electrode; forming a source electrode and a drain electrode by application on a part of a surface of the gate insulating layer and a surface of the flattening layer to simultaneously form the source electrode and the drain electrode on the gate insulating layer and the flattening layer; and forming an organic semiconductor layer by application on the gate insulating layer between the source electrode and the drain electrode.

According to a tenth aspect of the present invention, there is provided a method of manufacturing an organic field effect transistor comprising a resin substrate, a gate electrode, a gate insulating layer, a source electrode, a drain electrode, and an organic semiconductor layer, the method comprising the steps of forming a flattening layer by application on at least a resin substrate; forming a hydrophobic organic layer by application on the flattening layer; subjecting the hydrophobic organic layer to such a treatment as to form a first region in a surface of the hydrophobic organic layer or a surface of the flattening layer and to also form a second region in a surface of the hydrophobic organic layer, the first and the second regions having different surface free energies; forming a gate electrode on only either one of the first and the second regions; forming a gate insulating layer by application on the gate electrode; forming a source electrode and a drain electrode by application on a part of a surface of the gate insulating layer and a surface of the flattening layer to simultaneously form the source electrode and the drain electrode on the gate insulating layer and on the flattening layer; and forming an organic semiconductor layer by application on the gate insulating layer between the source electrode and the drain electrode.

Incidentally, here, the expression of subjecting the hydrophobic organic layer to such a treatment as to form a first region in a surface of the hydrophobic organic layer or a surface of the flattening layer is intended to include a case where depending on the kind or degree of the treatment, a hydrophobic organic layer of a treated region is completely removed to expose a surface of a flattening layer and the exposed flattening layer surface becomes a first region.

In these methods of manufacturing an organic field effect transistor in accordance with the present invention, it is preferred that the surface free energy of the first region is made higher than the surface free energy of the second region.

Further, it is preferred that the gate electrode is formed in the first region.

Moreover, it is preferred that the methods comprise, after the step of forming the gate insulating layer, the steps of subjecting the gate insulating layer surface and the flattening layer surface (or the hydrophobic organic layer surface) simultaneously to such a treatment as to form, in the flattening layer surface (or the flattening layer surface or the hydrophobic organic layer surface), a third region and a fourth region having different surface free energies, and simultaneously to form, in the gate insulating layer surface, a fifth region and a sixth region having different surface free energies; and forming the source electrode and the drain electrode simultaneously by application on only either one of the third and fifth regions and the fourth and sixth regions.

Further, it is preferred that the surface free energy of the third region is made higher than the surface free energy of the fourth region and the surface free energy of the fifth region is made higher than the surface free energy of the sixth region.

Moreover, it is preferred that the source electrode and the drain electrode are formed in the third region.

Further, it is preferred that the first region has a water droplet contact angle of not less than 20° but no more than 50°; the second region has a water droplet contact angle of not less than 90° but no more than 130°; and the first region and the second region differ from each other in water droplet contact angle by 60° to 110°.

Moreover, it is preferred that the hydrophobic organic layer comprises a polymeric material containing at least a fluoroalkyl group, that the flattening layer comprises a phenolic resin, that the gate insulating layer comprises an insulating material selected from phenolic resins and silsesquioxane.

In addition, it is preferred that the gate insulating layer has a film thickness of not less than 0.3 µm but no more than 1.2 µm.

Further, it is preferred that the first region, the third region and the fifth region are each formed by subjecting a part in which the region is to be formed, selectively to at least one treatment of ultraviolet irradiation, plasma treatment, ozone treatment, corona treatment, and electron beam irradiation.

Moreover, it is preferred that the ultraviolet light used has a wavelength of not less than 150 nm but no more than 350 nm.

Further, it is preferred that the flattening layer comprises a curable resin.

Moreover, it is preferred that the flattening layer has an average surface roughness of not more than 0.2 nm and a maximum height of not more than 1 nm.

Further, it is preferred that the gate insulating layer has an average surface roughness of not more than 2 nm and a maximum height of not more than 10 nm.

Moreover, it is preferred that at least the source electrode and the drain electrode are formed using at least one coating method selected from of dip coating, ink jet method and microcontact printing.

In addition, it is preferred that at least the gate electrode and the gate insulating film are formed by at least one of screen printing, flexographic printing, dipping coating, and dispensing method.

DESCRIPTION OF THE PREFERRED EMBODIMENTS

Hereinafter, the present invention will be described in detail.

Figure 1:
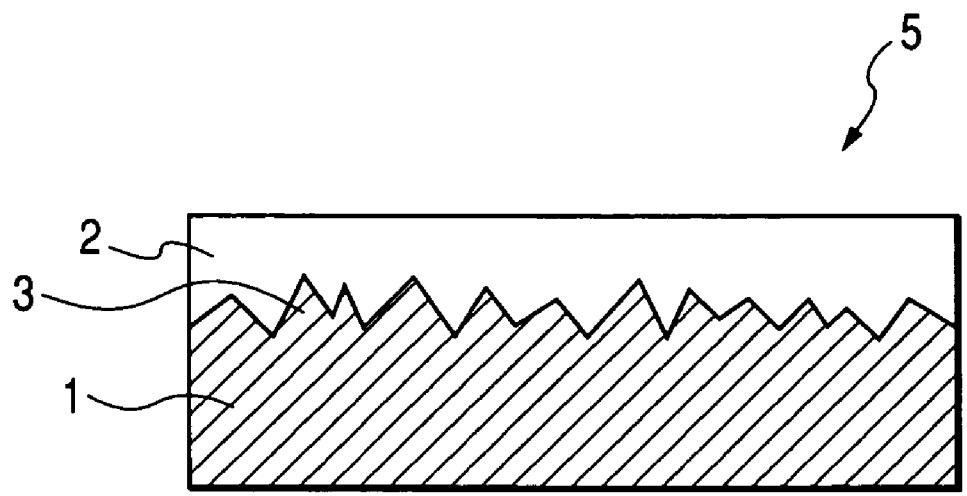
FIG. 1 is a conceptual sectional view showing an example of the substrate in accordance with the present invention.

A first embodiment of the substrate of the present invention will be described with reference to FIG. 1. FIG. 1 is a sectional view showing an example of the substrate of the present invention. A substrate 5 of the present invention consists of a base material 1 with an unevenness having surface protuberances (or bumps) 3 and an organic resin layer (flattening layer) 2 formed thereon so as to cover the protuberances 3. At this time, the base material 1 may have the organic resin layer 2 on not only one side but also on the both sides. The characteristics required for this organic resin layer 2 are that the flatness of the surface thereof is good. In addition, this organic resin layer 2 should also preferably be easy to be controlled in its properties such as wettability or the like. For example, if the organic resin layer 2 is sensitive to ultraviolet irradiation, electron beam irradiation, corona discharge, or ozone treatment, and those treatments modify the surface to impart hydrophilicity, control of the wettability becomes easy, which is preferable.

These components will be described below.

The base material 1 in the present embodiment is a base material having an average surface roughness of not less than 1.2 nm but no more than 5 nm and having a maximum peak height of surface unevenness (hereafter, simply referred to as "maximum peak height") of not less than 0.1 μm but no more than 1.0 μm), including, for example, semiconductor substrate such as pre-polishing silicon (Si), metal, glass, carbon, ceramic and resin base material. In addition, a base material with a multilayer structure formed of a plurality of materials or a base material with a structure such as of memory alloy is available as long as it has the aforementioned ranges of average surface roughness and maximum peak height. In particular, in view of economics, flexibility and workability, a base material made of an organic resin is preferable. Base materials made of an organic resin are generally inferior in its surface smoothness. Therefore, in the preferred embodiments of the present invention, in order to smooth the surface of a base material with poor surface smoothness, an organic resin layer 2 is provided. Incidentally, the preferable average surface roughness for the base material 1 is not less than 1.2 nm but no more than 4 nm and the preferable maximum peak height is not less than 0.1 μm but no more than 0.4 μm. Incidentally, unless otherwise noted, in the claims and specification, the terms "surface of base material," "surface roughness of base material" and "maximum peak height of base material" are all intended to refer to an interface between the base material and an organic resin layer (or an organic layer or a flattened layer), while the terms "surface of organic resin layer (or organic layer or flattening layer)," "surface roughness of organic resin layer (or organic layer or flattening layer)" and "maximum peak height of organic resin layer (or organic layer or flattening layer)" are all intended to refer to a surface opposite to the base material of the layer.

In the present invention, the concept "average surface roughness (Ra')" is obtained by applying the center line average roughness Ra defined by JIS B 0601 to a measuring surface followed by three-dimensional expansion and is expressed as "an average value of absolute values of deviations from a reference plane to a designated plane" and given by the equation (1):

$$Ra' = \frac{1}{S_0} \int_{Y_B}^{Y_T} \int_{X_L}^{X_R} |F(X, Y) - Z_0| d_x \, d_y \qquad (1)$$

wherein $Ra'$: average surface roughness value (nm);

$S_0$: area when assuming that the measuring surface is ideally flat, namely $|X_R - X_L| \times |Y_T - Y_B|$;

$F(X,Y)$: height at a measuring point $(X,Y)$, X being X coordinate, Y being Y coordinate;

$X_R - X_L$: range of X coordinate of the measuring surface;

$Y_T - Y_B$: range of Y coordinate of the measuring surface; and $Z_0$: average height within the measuring surface.

In case of a resin base material, because the rigidity is low, accurate measurement may not be effected due to deflection of the resin base material. In this case, a scanning probe microscope may be used conveniently.

In addition, the term "maximum peak height (Rp) of surface unevenness" refers to the maximum peak height of the height of surface unevenness. The term "height of surface unevenness" represents a height difference (or difference in level) between a top point of protrusion and a bottom point of recess formed on a surface of a coating. That is, within a measuring range, the term "maximum peak height (Rp)" is intended to mean the maximum height of protuberances (difference in height between peak and valley defined in "Definition and Indication of Surface Roughness" in JIS-B-0601).

In the present invention, the average surface roughness refers to a value measured with a scanning probe microscope. That is, the value is an average surface roughness when measured with DFM (Dynamic Force Mode) at a scanning frequency of 0.65 Hz and within a scanning range of 20 μm×20 μm. In addition, the maximum peak height represents a value measured with a stylus type difference in level measurement equipment within a measuring range of 1 mm at a scanning speed of 100 μm/s.

As base materials used in the present invention, resin base materials are preferable. Materials of the resin base materials preferably used in the present invention include polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyarylate (PAR), and polyamide-imide (PAI). Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc.

Here, the base material can be appropriately selected depending on the calcination temperature at the time of forming the organic layer 2 or the later-described fine structure 10 of the organic field effect transistor. In addition, in the embodiments of the present invention, the base material surface is provided with a flattening layer and a fine structure is formed thereon as preferred embodiments, but any base material that does not depart from the spirit of the present invention will not be excluded from the scope of the present invention. The film thickness of the resin base material may be any, and in order to make a substrate having strength and flexibility as well as workability at the same time, is preferably 20 to 500 μm, and more preferably 20 to 300 μm.

The present invention requires preferable characteristics to the organic resin layer 2, as follows.

The preferable characteristics required to the organic layer 2 include the ability to cover the protuberances 3 of the base material 1, and good smoothness of the organic layer 2 surface and moreover rapidness of change in wettability over time resulting from surface modification of the organic layer 2.

More specifically, at first, the average surface roughness (Ra') is preferably not more than 1 nm, and more preferably not less than 0.2 nm but no more than 1 nm, and further more preferably not less than 0.2 nm but no more than 0.8 nm. If the average surface roughness is more than 1 nm, when a conductive pattern is drawn by printing or the like on an organic resin layer, the edge may become unclear.

In addition, the maximum height of the surface unevenness of the organic resin layer is preferably not more than 30 nm, and more preferably not less than 2 nm but no more than 10 nm. If the maximum height of the surface unevenness of an organic resin layer is more than 30 nm, in case of forming a conductive layer on the organic resin layer, a sufficient conductivity may not be obtained.

In addition, the surface of the organic resin layer preferably has sensitivity to ultraviolet irradiation, electron beam irradiation, corona discharge, or ozone treatment. Here, the expression "have sensitivity" employed herein is intended to mean that these treatments cause a change in the water contact angle of the surface, for example, to obtain hydrophilicity.

The organic resin layer 2 of the present invention has a film thickness of preferably 1 to 10 μm and should importantly be able to cover the base material surface roughness and unevenness and to smooth the organic resin layer surface. A film thickness of less than 1 μm makes it difficult to flatten and smooth the base material surface, while a film thickness of more than 10 μm may results in occurrence of the problems such as warpage of the base material during the organic resin layer formation, worsening of the surface smoothness or nonuniform film thickness. The more preferable thickness is 1 to 6 μm, and further more preferably 1 to 5 μm. Making film thickness not more than 5 μm brings advantages such as improvement in film thickness uniformity and shortening of drying time, and the like.

Taking it into consideration that the substrate of the present invention is used to stack a conductive layer and an insulation layer, the thermal deformation temperature of the organic resin layer 2 is preferably not less than 130° C. In addition, in the case where a conductive layer is provided on the organic resin layer, the organic resin layer of the present invention preferably has a high insulating property. In particular, the surface resistivity is preferably $1.0 \times 10^{12}$ Ω/□ or more.

As a resin constituting the organic resin layer 2 of the present invention, there are included various resins such as thermoplastic resin, thermosetting resin and photocurable resin. The characteristics required to the resin constituting the organic resin layer 2 of the present invention are capability of flattening and smoothing the base material surface having unevenness.

As thermoplastic resin used as the organic resin layer 2 of the present invention, any thermoplastic resin will not be excluded as long as it has a glass transition temperature of not less than 130° C., more preferably 130 to 180° C. and is soluble in organic solvents, and it can form a coating film from its solution. In the case of thermoplastic resin, it can be heated to a temperature not less than the glass transition temperature to flatten unevenness of the base material surface and to smooth the surface. Examples of the usable thermoplastic resins include polyether, polyetherketone, polyetheretherketone, polysulfone, polyethersulfone, polyetherimide, polycarbonate, polyphenylene, polyamide, polyurethane, polyurea, polyester and resins having polycycloolefin skeleton. Because of high sensitivity to ultraviolet irradiation, electron beam irradiation, corona discharge, or ozone treatment after organic resin layer formation and high hydrophilizability, polyether, polyetherketone, polyetheretherketone and polycarbonate are preferable.

As a compound constituting the organic resin layer 2 of the present invention, curable (or hardening) resins are also preferable.

A curable resin generally consists of a resin, a cross-linking agent, a curing agent (hardener), a catalyst and the like, and such a curable resin is cured with heat or light to give the organic layer 2. Besides, a resin containing cross-linking groups itself can be cured in the presence or absence of a catalyst to obtain the organic layer.

Incidentally, because thermosetting resins are excellent in electrically isolating property, mechanical strength and heat resistance, and inexpensive, etc., they are used singulary or in combination with other resins for many purposes.

The softening point prior to hardening of the thermosetting resin for use in the present invention is preferably 50° C. to 160° C. In case of the softening point being less than 50° C., "flow" occurs during hardening, and in case of more then 160° C., sufficient reflow will not occur within hardening time, and in any case, flatness and smoothness will lower.

In addition, the resins to be used for the source materials of the thermosetting resin include phenolic resin, epoxy resin and acrylic resin and the like. Among them, phenolic resin is preferably used from the point of view of good water resistance, high thermal deformation temperature and good insulating property and the like. Mixtures of two or more of these resins may also be used.

General examples of phenolic resin include phenolic novolac resin, cresol novolac resin and the like, but as resins having other phenol groups, polyvinylphenol and the like may be used as well.

As examples of the phenolic resin, there my be used novolac resins such as phenol novolac resin, o-cresol novolac resin, bisphenol A novolac resin and copolymer phenol novolac resins obtained by using a plurality of phenolic components, or resole type phenolic resin and dibenzylether type phenolic resin having reactive cross-linking groups such as methylol groups or dimethylol groups and the like. In addition, modified novolac resins obtained by modifying novolac resins with oil or the like can be used. Among them, novolac resins are preferred and are advantageous in high film strength after baking, etc.

In addition, a cross-linking agent can be mixed into the phenolic resin to further improve the film strength after hardening.

Examples of cross-linking agents used in combination with phenolic resins include those having two or more functionalities such as epoxy compound, oxetane compound, isocyanate compound, melamine cross-linking agent and substituted urea cross-linking agent and the like. Among them, epoxy compound, melamine cross-linking agent and substituted urea cross-linking agent are preferable from the point of view of good hydrophilizability after ultraviolet irradiation and the like.

Examples of epoxy compound include bisphenol A diglycidyl ether, bisphenol F diglycidyl ether, bisphenol AF diglycidyl ether, hexahydrobisphenol A diglycidyl ether, tetraphenylglycidyletherethane, triphenylglycidylethermethane, phenol novolac epoxy resin, cresol novolac resin epoxy resin, hexahydro phthalate glycidyl ether, triglycidyl isocyanurate, epoxidized soybean oil and 3,4-epoxy cyclohexylmethyl carboxylate and the like.

Examples of melamine cross-linking agents and substituted urea cross-linking agents include hexamethoxymethylmelamine, hexamethoxymethylolmelamine, hexamethylolmelamine, methoxymethylated glycoluril, methylol glycoluril, tetramethoxymethyl glycoluril and those obtained by resinification of these compounds and the like.

The addition amount of the cross-linking agent is preferably 1 to 200 parts by weight for 100 parts by weight of the resin, and more preferably 10 to 200 parts by weight. With an addition amount of less than 1 part by weight, the hardening time is too long, while when exceeding 200 parts by weight, unreacted cross-linking moiety exists too much to possibly deteriorate the characteristics of the film.

In order to effectively cross-link the resin with the cross-linking agent, a catalyst may additionally be used. As the catalyst for use in combination with the phenolic resin, either an acid catalyst or a basic catalyst may be used, but selectable catalyst is different depending on the kind of the cross-linking agent. For example, in the case of using the above-mention melamine cross-linking agent or substituted urea cross-linking agent as the cross-linking agent, an acid catalyst is mainly used. As the acid catalyst, there may be used carboxylic acids such as formic acid, acetic acid, oxalic acid and the like, sulfonic acids such as p-toluenesulfonic acid and camphorsulfonic acid and the like, Lewis acids such as boron trifluoride and phosphorus pentafluoride and the like. The sulfonic acid and the Lewis acid are generally less soluble in organic solvents, and moreover not stable at room temperature, and therefore their amine salt and complex may be used. The basic catalyst is well known to react hydroxyl groups of a phenolic resin with an epoxy compound. Examples of the basic catalyst include organic amines such as imidazoles and diethylenetriamine.

The preferable addition amount of the catalyst is 0.1 to 10 parts by weight per 100 parts by weight of the total amount of the resin and the cross-linking agent. With an addition amount less than 0.1 part by weight, hardening is insufficient to lower the solvent resistance and film strength, while when exceeding 10 parts by weight, the water absorbability of the film increases to make it difficult to maintain the characteristics of the film.

As the solvent to dissolve the resins and the like, methyl cellosolve, ethyl cellosolve, butyl cellosolve, methyl cellosolve acetate, diethylene glycol monomethyl ether, diglyme, propylene glycol, propylene glycol monomethyl ether, propylene glycol monomethyl ether acetate, toluene, xylene, chlorobenzene, methyl ethyl ketone, methyl isobutyl ketone, cyclohexanone, cyclopentanone, 2-hydroxypropionic acid ethyl, butyl acetate, ethyl lactate, butyl lactate, tetrahydrofuran and 1,4-dioxane and the like may be used. These organic solvents may be used singularly, or in combination of two or more.

Among the solvent, propylene glycol monomethyl ether, propylene glycol monomethyl ether acetate, ethyl lactate, butyl lactate and cyclohexanone are preferable from the point of view of improving leveling performance.

In addition, in the case where viscosity is desired to be controlled depending on the printing method selected, as a diluent the liquid type epoxy may be used singularly or in combination with a solvent.

In order to maintain the smoothness of the obtained organic resin layer surface, it is important to prevent intrusion of dust or the like as far as possible and prefiltration using a membrane filter is preferred.

Examples of the method for applying the organic resin layer of the present invention include spin coating, cast coating, dip coating, drop coating, spray coating, doctor blade coating, dye coating, printing method such as offsetting or screening, an ink jet method, and the like. The dipping method is preferable and can treat flexible base material such as a resin base material or a base material with a large area at a time.

In the present invention, by applying an organic resin solution to a base material and then effecting heating subject, it is possible to fill the unevenness on the substrate surface to effect flattening and to form an organic resin layer such that the average surface roughness of the organic resin layer is, for example, not less than 0.2 nm but no more than 1 nm and the maximum height is, for example, not more than 30 nm. The heating temperature is preferable 130° C. to 220° C., and can be changed desirably depending on the resin selected. A heating temperature less than 130° C. does not provide sufficient reflow not only to lower the flatness and smoothness but also to make sufficient strength unobtainable. When exceeding 220° C., rapid heating causes film shrinkage to pose problems such as occurrence of cracks. As heating methods, there may be applied those using a hot plate, a hot-air circulating oven, a halogen lamp, an IR heater, a ceramic heater, an IH heater and the like.

Figure 2:
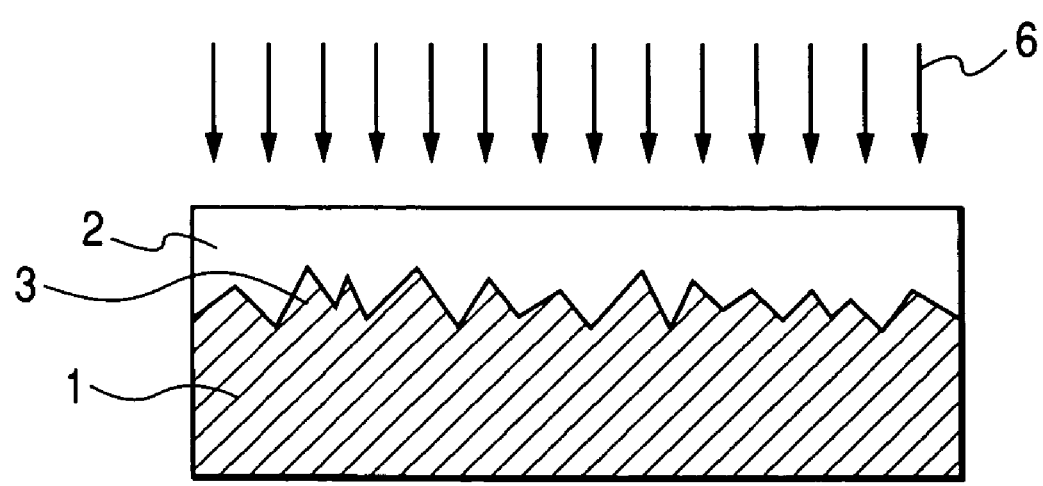
FIG. 2 is a conceptual view showing an example of a step of modifying a surface of an organic resin layer 2 in accordance with the present invention.

The organic resin layer 2 of the present invention is sensitive to energy irradiation such as shown by arrows 6 in FIG. 2 including ultraviolet irradiation, ozone treatment, corona discharge, electron beam irradiation and plasma surface treatment and the like, and as shown in FIG. 2 a part or the whole of the organic resin layer surface can undergo surface modification with these treatments to form a hydrophilic region. Among these methods, one may be selectively used or two or more may be used in combination. The standard for selection of the treatment is that the water contact angle of the organic resin layer changes within a short period of time to reach a desired value. The water contact angle to reach by the hydrophilizing surface modification of the organic resin layer surface is 5° to 55° and, considering that coating is implemented with a water slurry and the like, 15° to 45° is more preferable. Moreover, it is more preferable that the water contact angle can be controlled within the range of 5° to 55° by changing the treatment time. In addition, when the organic resin layer 2 is formed on the both sides of the base material in the same composition, only one side may undergo surface treatment, and the both sides may undergo surface treatment from the top and from the bottom at the same time or each side in order.

Among these surface treatments, the most preferred is ultraviolet irradiation or the combination of ultraviolet irradiation and ozone treatment. In the case of ultraviolet irradiation, the light preferably has a wavelength of 150 nm to 350 nm. The standard for selection of this wavelength is also that the contact angle of the organic resin layer surface can be changed within a short period of time. As a light source of the ultraviolet irradiation, any light source giving sufficient light intensity such as a mercury lamp, a KrCl excimer lamp, an XeCl or $Xe_2$ excimer lamp and the like are usable. Moreover, by combining ultraviolet irradiation with ozone treatment, surface treatment by light irradiation can be implemented efficiently.

Figure 3:
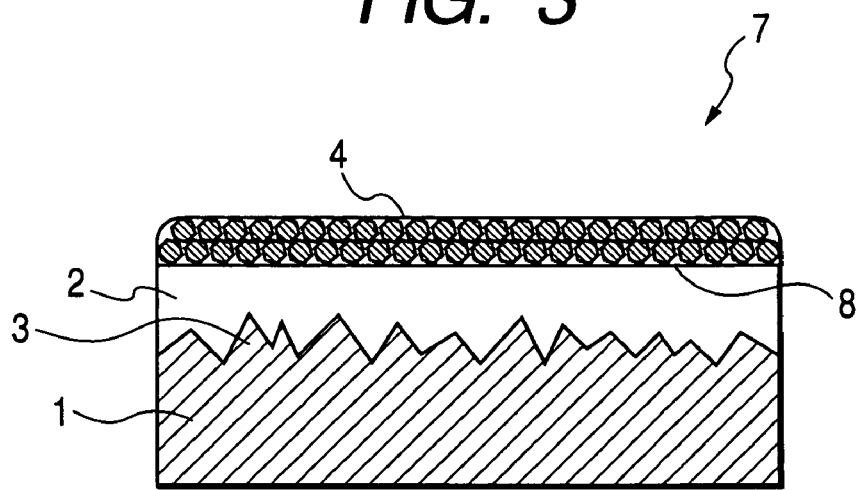
FIG. 3 is a conceptual sectional view showing an example of the conductive substrate in accordance with the present invention.

The conductive substrate of the present invention is obtainable as shown in FIG. 3 with provision of a conductive layer 4 in a hydrophilic region 8 on the organic resin layer 2 of the substrate. For the conductive layer, metals such as gold, copper, silver, platinum, chromium, aluminum and nickel and the like, metal oxides such as ITO, $SnO_2$, and ZnO or conductive polymer such as polythiophene, polyaniline, polypyrrole and the like are used.

As the method to form the conductive layer, a dry film-forming method such as evaporation, sputtering, ion plating, or a wet film-forming method such as plating, electrodeposition, coating using slurry, paste or solution may be selected and used. In the case where the organic resin layer 2 is formed on the both sides of the base material 1, those both sides may be provided with the conductive layer 4.

In particular, the substrate of the present invention is suitable when a conductive layer is formed by using a slurry or paste prepared by dispersing metal fine particles or conductive polymer in water or an organic solvent or a solution of an organic metal compound. By treating the organic resin layer 2 surface on the substrate of the present invention with the above-described method, the slurry or paste can be uniformly applied onto the substrate surface with a simple method such as dip coating, drop coating, spray coating, doctor blade coating, dye coating, printing method such as offsetting or screening, an ink jet method, and the like, so that a conductive layer containing conductive fine particles of an average particle diameter 10 nm to 2 μm can easily be formed on the organic resin layer of the present invention. Such methods enable a substrate with a conductive layer of a surface resistivity of not more than 5 kΩ/□ to be formed. The shape of the conductive fine particles forming the conductive layer at this time may be either spherical or any other shapes, for example, may be scale pieces or sticks and the like. In particular, when particles take such a form as to bring parts thereof into fusion each other, the resistance decreases to show a high conductivity.

As a representative example of the slurry or paste of conductive fine particles, there are included colloidal silver liquid having silver fine particles dispersed in water, and a silver paste having silver fine particles dispersed in an organic solvent, a solution of an organic silver compound and the like, and a slight amount of a resin may be added in order to improve dispersion of fine particles or bring silver fine particles into fusion at the time of calcination. In addition, there can also be used a conductive slurry prepared by dispersing into water conductive polymer fine particles having a conductive polymer doped with sulfonic acid, etc. Representative examples thereof include water dispersion of poly(3,4-ethylenedioxythiophene) and poly(4-styrene sulphonic acid).

Heating the conductive fine particles or organic silver compounds coated on the organic resin layer surface leads to solvent evaporation, decomposition of added resin or organic groups, melting of fine particles themselves, whereby conductive fine particles can get together by association to enable a conductive layer to be formed. The temperature at that time is generally 130 to 300° C., but more preferably 130 to 220° C.

The thickness of the conductive layer is preferably 30 nm to 10 nm.

Next, a second embodiment of the substrate of the present invention will be described with reference to FIG. 5. In the present embodiment, two organic resin layers are provided, on which a fine structure is formed.

Figure 5:
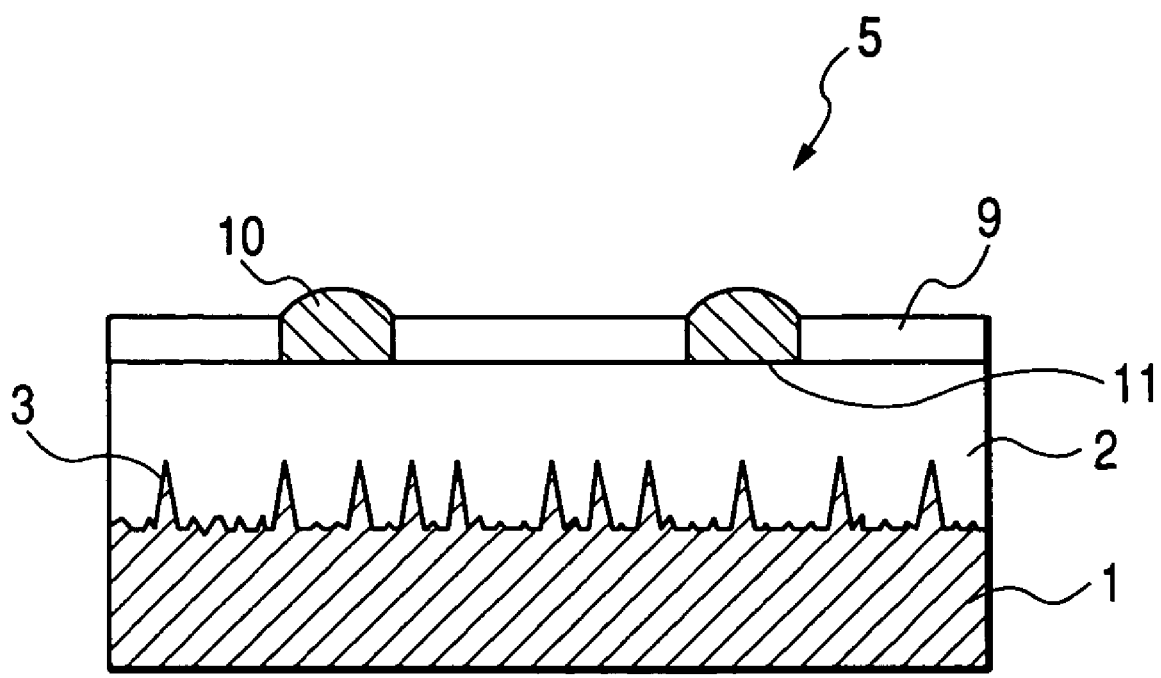
FIG. 5 is a conceptual sectional view showing an example of the fine structure substrate in accordance with the present invention.

FIG. 5 is conceptual view showing the construction of an example of the fine structure substrate of the present invention. On a resin base material 1 having protuberances (or bumps) 3 of 200 nm to 300 nm, an organic layer 2 covering the protuberances 3 are provided. The characteristics required for this organic resin layer 2 is that the surface has good smoothness and the wettability can easily be controlled by surface modification. A hydrophilic organic layer 9 is formed on this organic layer 2. At a part of the hydrophobic organic layer 9, a fine structure 10 is formed. The surface and an interface 11 with the organic layer 2 of the hydrophobic organic layer 9 where the fine structure 10 is formed have been modified to have wettability of hydrophilicity. This hydrophobic organic layer 9 is a layer effective to obtain a fine structure with a fine pattern.

The organic layer in the present embodiment is the same as the organic resin layer described so far. In addition, the layers and members other than the hydrophobic organic layer are the same as those described so far.

Hereinafter, the hydrophobic organic layer 9 will be described. This hydrophobic organic layer 9 is a layer provided to form a minute fine structure. That is, in order that the fine structure 10 is formed in the hydrophilic portion made hydrophilic by the modification of the surface and the interface with the organic layer 2 of hydrophobic organic layer 9, it is important that the fine structure is not formed in portion other than the hydrophilic portion. That is, the characteristics required for this hydrophobic organic layer 9 includes that the contact angle with water is high and the contact angle changes within a short period of time by the surface modification. The compound suitable as the hydrophobic organic layer 9 includes fluororesins.

The fluororesin is a polymer mainly comprised of carbon and fluorine and includes polytetrafluoroethylene, polychlorofluoroethylene, polyvinylidene fluoride, polyvinyl fluoride, tetrafluoroethylene-hexafluoropropylene copolymer, tetrafluoroethylene-ethylene copolymer, tetrafluoroethylene-perfluoroalkylvinylether copolymer, chlorotrifluoroethylene-ethylene-copolymer, polytetrafluoroethyleneoxide, polyhexafluoropropyleneoxide, polyperfluoroalkylacrylate and polyperfluoroalkylmethacrylate and the like.

The thickness of the hydrophobic organic layer 9 is preferably 5 to 100 nm and more preferably 5 to 80 nm. A film thickness of less than 5 nm makes it impossible to form uniform coating film, whereby sufficient hydrophobicity may not be developed. On the other hand, when exceeding 100 nm, the time required for surface modification will become long.

The fine structure 10 will be described below.

For the fine structure 10, the fine structure material for use may be changed depending on the intended purposes. As the fine structure material, a conductive material is used in case of a circuit substrate, a conductive material or an insulating material is used in case of a semiconductor device, and an insulating material or a conductive material is used in case of a device for image display. As material for use, those having a good affinity with the hydrophilized portion of the hydrophobic organic layer 9 and show poor wettability in the hydrophobic organic layer are preferred.

As the conductive materials, metals such as gold, copper, silver, platinum, chromium, aluminum and nickel and the like, metal oxide such as ITO, $SnO_2$ and ZnO, or conductive polymers such as polythiophene, polyaniline and polypyrrole and the like are used.

In addition, the substrate of the present invention is suitable when a conductive layer is formed by using a slurry or paste prepared by dispersing metal fine particles or conductive polymer in water or an organic solvent. The shape of the conductive fine particles forming the conductive layer at this time may be either spherical or any other shape such as scale pieces.

As a representative example of the slurry or paste of conductive fine particles, there are included colloidal silver liquid having silver fine particles dispersed in water, and a silver paste having silver fine particles dispersed in an organic solvent, a solution of an organic silver compound and the like, and a slight amount of a resin is generally added thereto in order to improve dispersion of fine particles or bring silver fine particles into fusion at the time of calcination.

Further, there can also be used a conductive slurry prepared by dispersing into water conductive polymer fine particles having a conductive polymer doped with sulfonic acid, etc. Representative examples thereof include water dispersion of poly(3,4-ethylenedioxythiophene) and poly(4-styrene sulphonic acid).

In addition, examples of the insulating material include, for example, polyimide, polyamide, polyester, polycarbonate, polysulfone, polybenzimidazole, phenolic resin, polyurethane resin, epoxy resin, acrylic resin, methacrylic resin, unsaturated polyester and siloxane compounds having organic functional groups and the like.

Methods for forming the fine structure 10 of the present invention will be described in detail below with reference to the drawings. FIGS. 6A and 6B and FIGS. 7A and 7B are views showing the steps of a method of manufacturing a fine structure substrate in accordance with the present invention.

Figure 6A:
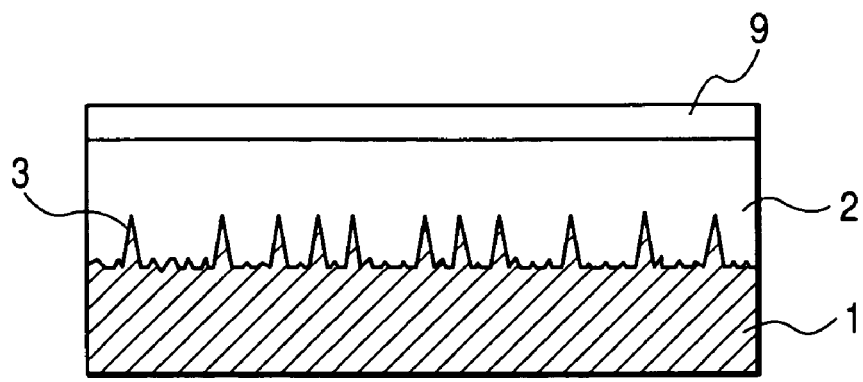
FIGS. 6A and 6B are views showing a former half of steps of an example of the manufacturing method of a fine structure substrate in accordance with the present invention.
Figure 6A:
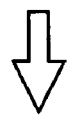

The method consists of "hydrophobic organic layer forming step" in which at first, as shown in FIG. 6A, a resin base material 1 is coated with an organic resin solution and thereafter heated to form an organic layer 2 with a surface roughness of not more than 1 nm and with a maximum peak height of the surface unevenness of not more than 30 nm and a hydrophobic organic layer 9 is formed on the organic layer 2, "hydrophilic portion forming step" in which the hydrophobic organic layer 9 is subjected to surface modification to form a hydrophilic portion 13 that is hydrophilic and "fine structure forming step" to form a fine structure 10 in the hydrophilic portion.

Firstly, in the "hydrophobic organic layer forming step" (FIG. 6A), for example the organic layer 2 is dip coated with a solution having perfluoroalkylacrylate copolymer dissolved therein.

The water contact angle of the hydrophobic organic layer 9 is preferably 80° to 130°, more preferably 100° to 120°. In case of the contact angle of less than 80°, the hydrophobic organic layer 9 is also coated with the fluid and therefore it is impossible to form a minute fine structure on the organic layer 2. In addition, under the present circumstances, it is difficult to obtain a water contact angle of more than 130° only with the hydrophobic organic layer 9.

Next, in the "hydrophilic portion forming step" (FIG. 6B and FIG. 7A), through a photomask 12, etc., having a predetermined pattern set above the hydrophobic organic layer 9, the hydrophobic organic layer is modified. The surface modification method at this time includes ultraviolet irradiation, ozone treatment, corona discharge, electron beam irradiation and plasma treatment and the like. Moreover, the hydrophilic portion may directly be formed using an ultraviolet laser beam or by condensed electron beam irradiation or the like. Among these methods, one may be selected or two or more may be combined. It is preferable to select appropriately a method by which the water contact angle of the hydrophobic organic layer changes in a short period of time to reach a desired value and a fine hydrophilic pattern ca be obtained.

Among these surface treatments, an appropriate method is ultraviolet irradiation or the combination of ultraviolet irradiation and ozone treatment. Ultraviolet irradiation is suitable for using a photomask to obtain a fine pattern. In the ultraviolet irradiation, use of a light with a wavelength of 150 nm to 350 nm is preferable and one with 200 nm to 350 nm is more preferable. When selecting the wavelength, it is preferable that the rate of change over time in the contact angle of the hydrophobic organic layer 9 is large and a hydrophilic portion with a fine pattern can be obtained. As a light source for the ultraviolet irradiation, any light source giving sufficient light intensity such as a mercury lamp, a KrCl excimer lamp, an XeCl excimer lamp and the like are usable. Within this wavelength range, because absorption by quartz is low, quartz may be used as a substrate material of the photomask.

In addition, when using ultraviolet irradiation in combination with ozone treatment, surface treatment time can shortened compared with use of the light irradiation only, which is effective. As the light source, those having a wavelength of 150 nm to 350 nm are selected as preferable ones. That is, a low-pressure mercury lamp or an $Xe^2$ excimer lamp is used. In this case, although quartz cannot be used, a synthesized quart or metal mask is used to obtain a fine pattern latent image.

Further, in any of these two kinds treatments, irradiation may be effected with the mask being in close contact with or apart by a given distance from the hydrophobic organic layer.

It is desirable that when the hydrophobic organic layer 9 is subjected to surface modification, the contact angle of the surface decreases in a short period of time. As the compound suitable as the material of the hydrophobic organic layer 9 that has a large water contact angle and a large rate of change in the contact angle over time, fluororesins are mentioned.

The fluororesins are polymers mainly comprised of carbon and fluorine and include polytetrafluoroethylene, polychlorofluoroethylene, polyvinylidene fluoride, polyvinyl fluoride, tetrafluoroethylene-hexafluoropropylene copolymer, tetrafluoroethylene-ethylene copolymer, tetrafluoroethylene-perfluoroalkylvinylether copolymer, chlorotrifluoroethylene-ethylene-copolymer, polytetrafluoroethyleneoxide, polyhexafluoropropyleneoxide, polyperfluoroalkylacrylate and polyperfluoroalkylmethacrylate and the like.

Figure 6B:
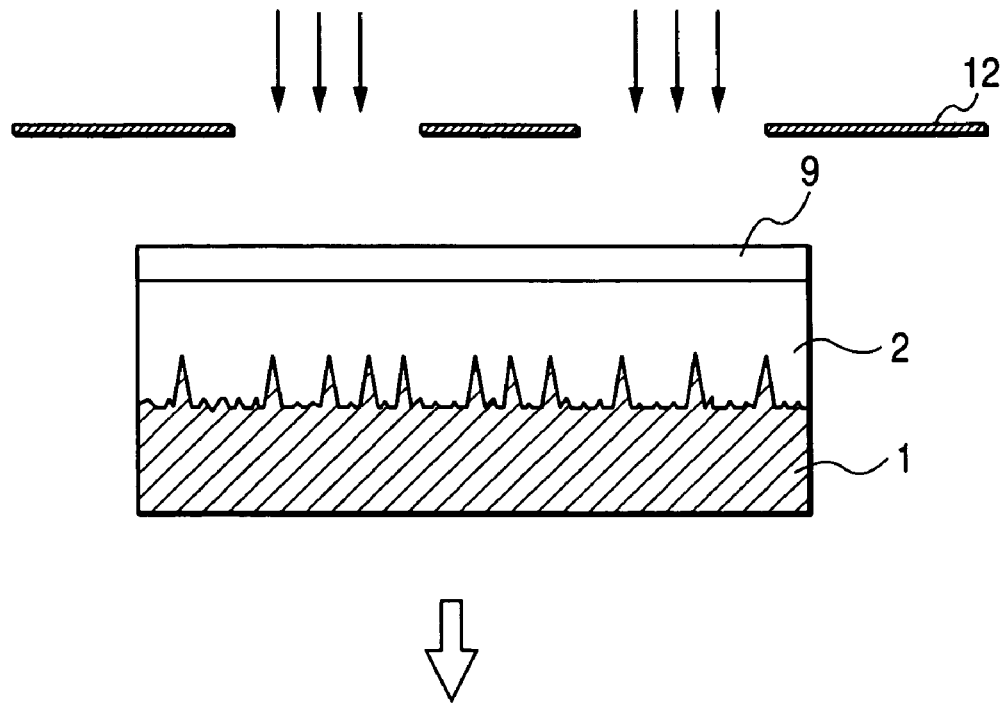
Figure 7A:
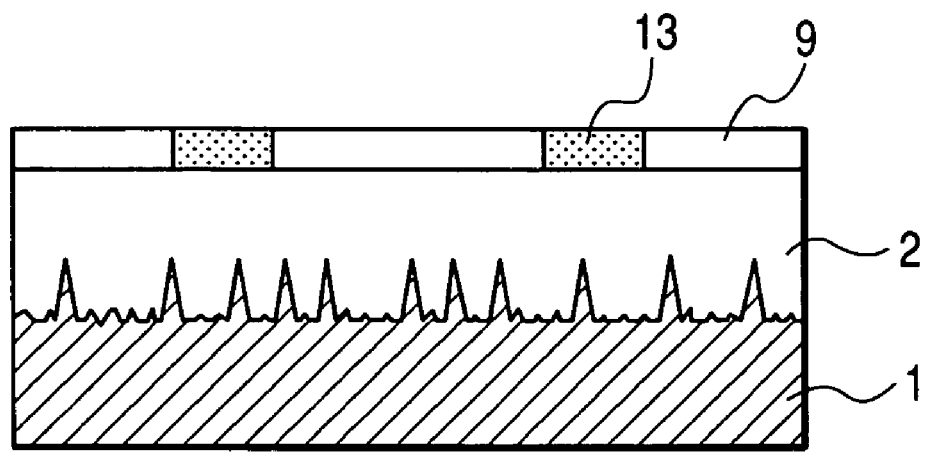
FIGS. 7A and 7B are views showing a latter half of steps of an example of the manufacturing method of a fine structure substrate in accordance with the present invention.
Figure 7B:
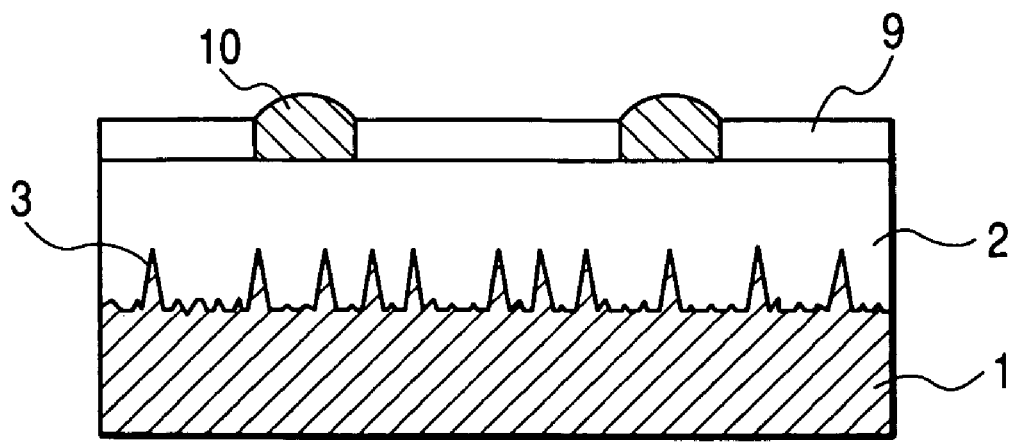

Next, a hydrophilic portion pattern (FIG. 7A) will be described. FIG. 7A shows a pattern of a hydrophilic portion 13 at a surface of the hydrophobic organic layer 9 subjected to the hydrophilic portion pattern forming step (FIG. 6B). The hydrophilic portion 13 subjected to surface modification in the hydrophilic portion pattern forming step has been made hydrophilic. The water contact angle of the hydrophilic portion is not less than 5° but no more than 55°, preferably 20° to 50°. The water contact angles as well as surface free energies of the hydrophilic portion 13 and the hydrophobic organic layer 9 are important to form the fine structure substrate as well as the organic field effect transistor using the same, and therefore will be described in detail.

The difference between the water contact angle of the hydrophilic portion 13 and the water contact angle of the hydrophobic organic layer 9 is an important indicator to obtain the fine structure. The term "contact angle difference" employed herein refers to a difference in water contact angle between the hydrophilic portion 13 subjected to the surface modification and the hydrophobic organic layer 9. If this contact angle difference is not sufficient, a fine structure material applied to the hydrophilic portion as the hydrophilic portion patter will be applied also to the hydrophobic portion, making it impossible to obtain a fine structure. At this time, the preferable contact angle difference to obtain the fine structure substrate is not less than 30° but no more than 110°. More preferable contact angle is not less than 50° and nor more than 110°. With a contact angle of less than 30°, the hydrophobic portion of the hydrophobic organic layer 9 is also coated with the fine structure material, so that it may become impossible to form a fine structure. On the other hand, a contact angle over 110° makes controlling only with the hydrophobic organic layer difficult. That is, the water contact angle of the hydrophobic organic layer 9 of more than 130° makes uniform film formation difficult.

Next, the "fine structure forming step" (FIG. 7B) is a step to apply a fine structure material on the hydrophilic portion pattern obtained in the hydrophilic portion pattern forming step to thereby form a fine structure. The fine structure is obtained by coating the hydrophilic portion 13 made hydrophilic by the surface modification with fine structure material. As this fine structure material, those having an affinity with to the hydrophilic portion is selected and used. As the fine structure, in case of usage as an electrode, conductive polymer, colloidal metal and the like are used.

Further, as the application method of the fine structure material, there are preferably included dip coating, roll coating, an ink jet method, dispense coating, spin coating, cast coating, spray coating, doctor blade coating, dye coating, printing, micro-contact printing, and the like. A suitable method is selected from these coating methods appropriately in consideration of the compatibility of the fine structure material with the hydrophilic portion. The dip coating and the like are suitable for forming a large-area fine structure substrate at low cost. In this case, although the substrate having the hydrophilic portion formed therein is dipped, the sufficient difference in the contact angle of the hydrophilic portion and the hydrophobic portion makes it possible to provide a fine pattern. In addition, because the substrate has sufficient smoothness, no blurring due to protuberances or the like will not occur.

Moreover, in order to form the fine structure, the ink jet method is also suitable. This is because the fine structure material can be applied only to the hydrophilic portion pattern. Moreover, the fine structure substrate of the present invention has sufficient smoothness so that blurring due to protuberances will not occur.

Next, of the present invention, the organic field effect transistor and the manufacturing method thereof will be described in detail.

As described above, one of the objects of the present invention is to provide a method of manufacturing an organic field effect transistor comprising a minute stack type fine structure by applying a fluid on a resin base material having a number of protuberances on a surface thereof.

Further, another object is to provide an organic field effect transistor in which an electrode layer, an insulating layer and an organic semiconductor layer are stacked as a fine structure.

Moreover, still another object is to provide an organic field effect transistor in which the surface free energies of the electrode layer and the insulating layer are controlled to form a minute and precise pattern.

In the organic field effect transistor comprising a fine structure stacked on a resin base material, as to the formation by application, control of smoothness of each layer and surface free energies, covering of protuberances on the resin base material and smoothness of the substrate surface are important.

In the following, important components of the organic field effect transistor of the present invention will be described.

Figure 8A:
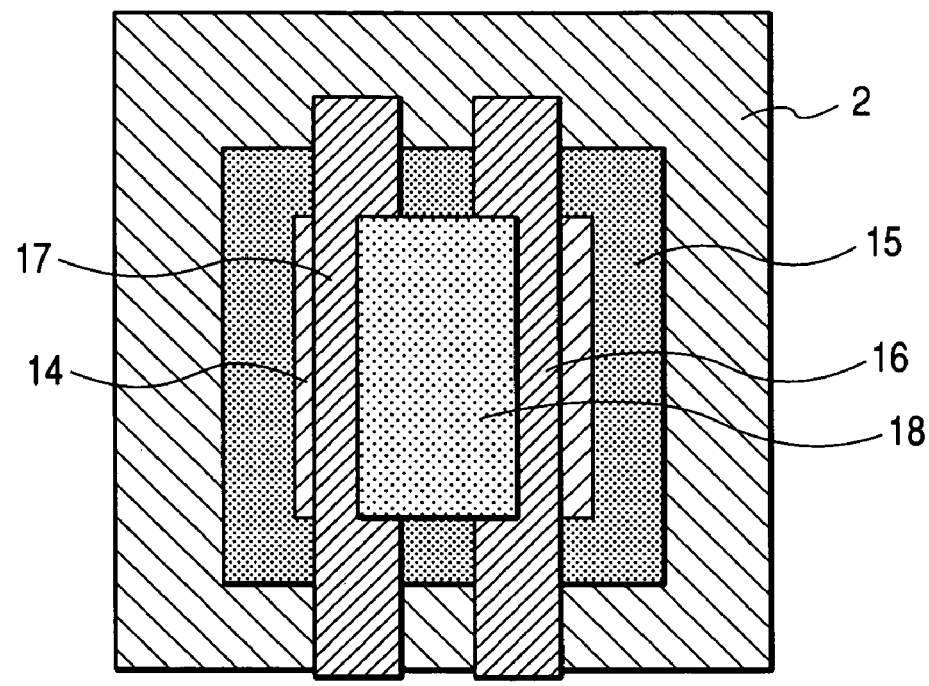
FIGS. 8A and 8B are conceptual sectional views showing an example of the organic field effect transistor in accordance with the present invention.
Figure 8B:
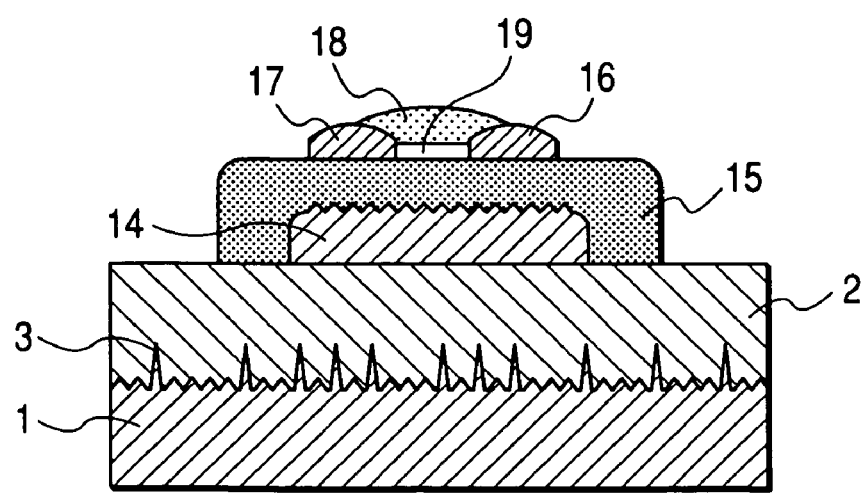

A preferred embodiment of the organic field effect transistor of the present invention will be described with reference to FIGS. 8A and 8B. FIGS. 8A and 8B are views show the structure of an example of the organic field effect transistor of the present invention, and FIG. 8A shows a top view of the organic field effect transistor while FIG. 8B shows a sectional view of the organic field effect transistor, the structure being called bottom contact structure.

This organic field effect transistor consists of a base material 1 made of, for example, a resin, a flattening layer 2, a gate electrode 14, a gate insulating layer 15, a source electrode 16, a drain electrode 17, an organic semiconductor layer 18 and an interface treatment layer 19.

In the present embodiment, the flattening layer 2 is provided on the resin base material 1 having protuberances (or bumps) 3 of 200 nm to 1,000 nm. This flattening layer 2 is a layer to cover the protuberances 3 of the resin substrate 1 completely and improve the smoothness of its surface. Further, it is preferable that this flattening layer 2 is easy to control the surface free energy by surface modification. On this flattening layer 2, the gate electrode 14 is provided. The gate insulating layer 15 is provided so as to cover this gate electrode 14 and to cover even a part of the flattening layer. The source electrode 16, the drain electrode 17 and the interface treatment layer 19 are provided on the gate insulating layer 15. The source electrode 16 and the drain electrode 17 are formed in a pattern over the gate insulating layer 15 and the flattening layer 2. Moreover, the organic semiconductor layer 18 is provided on the source electrode 16, the drain electrode 17 and the interface treatment layer 19.

A preferable organic field effect transistor of the present invention is manufactured using a pattern forming method such as a coating method and a printing method and the like, and the respective layers of the organic field effect transistor preferably have the characteristics appropriate for such manufacturing methods. The characteristics are that the surface free energy can be controlled appropriately and the average surface roughness is sufficiently small.

Figure 9A:
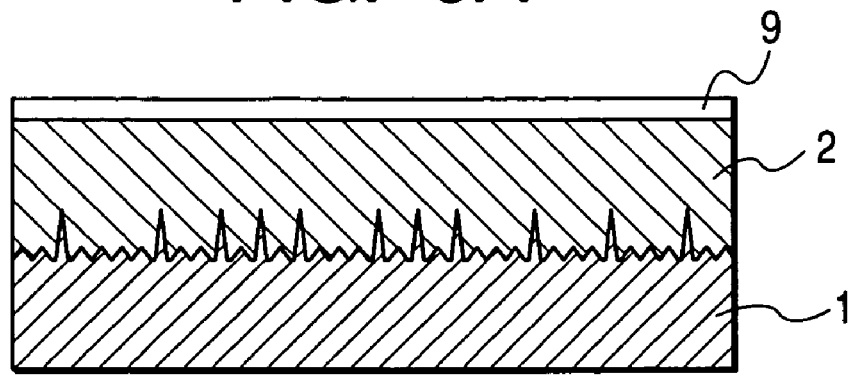
FIGS. 9A, 9B and 9C are conceptual views showing an example of forming steps of the organic field effect transistor in accordance with the present invention.
Figure 9B:
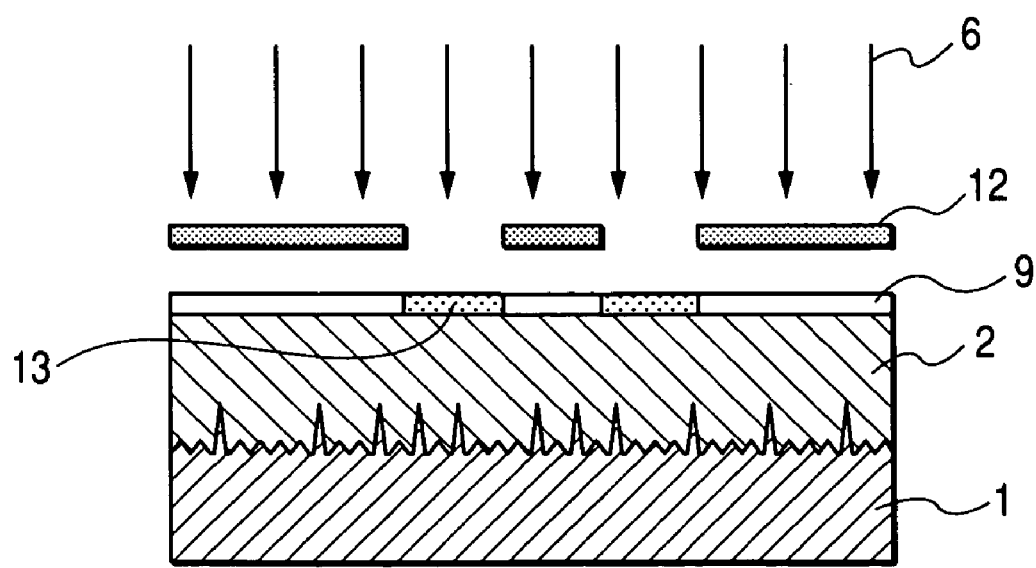
Figure 9C:
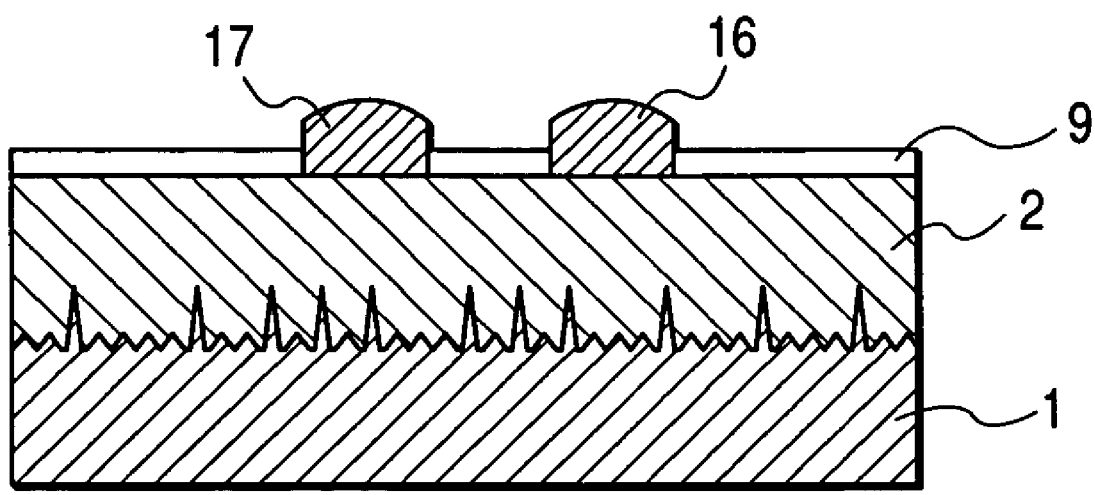

These points will be described with reference to FIGS. 9A, 9B and 9C. FIGS. 9A to 9C are views illustrating a part of the steps for forming a organic field effect transistor, and explaining the case where, for example, the source electrode 16 and the drain electrode 17 are formed in the pattern on the flattening layer. Incidentally, FIGS. 9A to 9C are to show general steps of the method of forming a fine structure in accordance with the present invention, and partially overlaps those shown in FIG. 6A to FIG. 7B, and the description made above with reference to FIG. 6A and FIG. 7B applys also to these figures. In addition thereto, the description made above as to preferable materials and preferable parameters applys in principle also to these figures.

FIG. 9A shows "hydrophobic organic layer forming step" of forming a hydrophobic organic layer 9 on a resin substrate 5, FIG. 9B shows, "latent image forming step" of subjecting the resin substrate 5 and the hydrophobic organic layer 9 to surface modification to form a hydrophilic latent image, and FIG. 9C shows a step of forming a source electrode 16 and a drain electrode 17 on the latent image on the surface of the material subjected to the latent image forming step.

At first, in the "hydrophobic organic layer forming step" (FIG. 9A), the hydrophobic organic layer 9 is formed on the flattening layer 2 on the resin base material 1 by application. This flattening layer 2 is, as described above, a layer to cover the protuberances 3 of the resin base material 1 completely and improve the smoothness of the surface. Generally, the resin base material 1 is poor in the surface smoothness and is large in the average surface roughness (Ra'), or is large in the maximum roughness (Rmax). The definitions and measuring methods of these factors are as described above.

Next, the hydrophobic organic layer 9 will be described. This hydrophobic organic layer 9 is a layer provided to form the source electrode 16 and the drain electrode 17. That is, in order that the source electrode 16 and the drain electrode 17 reflecting the latent image is formed in the hydrophilic portion made hydrophilic by modification of the surface and the interface with the flattening layer 2 of the hydrophobic organic layer 9, it is important that the source electrode 16 and the drain electrode 17 are not formed in a portion outside of the latent image. That is, it is preferable that this hydrophobic organic layer 9 is high in water contact angle.

More specifically, the water contact angle of the hydrophobic organic layer 9 is preferably 80° to 130°, more preferably 90° to 120°, and most preferably 100° to 120°. With a contact angle of less than 80°, because the fluid will be applied also to the hydrophobic organic layer 9 in many cases, it may become difficult to form the source electrode 16 and the drain electrode 17 minutely on the flattening layer 2. On the other hand, it is difficult to provide a water contact angle of more than 130° only to the hydrophobic organic layer.

In the next "latent image forming step" (FIG. 9B), the flattening layer 2 having the hydrophobic organic layer 9 formed thereon is modified through a photomask or the like of a predetermined pattern. The surface modification method at this time is as described as to the "hydrophilic portion forming step" (FIGS. 6B and 7A).

Next, the step (FIG. 9C) for forming the source electrode 16 and the drain electrode 17 will be described. As shown in FIG. 9B, the portion subjected to surface modification has been made hydrophilic to become the hydrophilic portion 13. The surface free energies of this hydrophilic portion 13 and the flattening layer 2 are, as described above, important in forming the organic field effect transistor having a fine structure substrate.

The difference between the water contact angle of the hydrophilic portion 13 and the water contact angle of the hydrophobic organic layer 9 is an important indicator to obtain a minute pattern such as that of the source electrode 16 and the drain electrode 17. The contact angle difference here refers to the difference between the contact angle of the flattening layer 2 subjected to the surface modification and the contact angle of the hydrophobic organic layer 9. If this contact angle difference is not sufficient, the fluid applied to the hydrophilic portion 13 is applied also to the hydrophobic organic layer 9, thus making it impossible to obtain a minute pattern. At this time, the preferable contact angle difference to obtain a minute pattern is not less than 30° but no more than 110°. More preferable contact angle is not less than 50° and nor more than 110°. With a contact angle of less than 30°, the fluid is applied also to the hydrophobic organic layer 9, thereby possibly making formation of a minute pattern impossible. On the other hand, making the contact angle more than 110° is difficult to be controlled only with the hydrophobic organic layer 9. That is, at the water contact angle of the hydrophobic organic layer 9 of more than 130°, uniform film formation is difficult.

In addition, in order to obtain the minute pattern such as that of the source electrode 16 and the drain electrode 17, the surface free energy itself of the hydrophilic portion 13 is also important. That is, the preferable water contact angle of this hydrophilic portion 13 is preferably not less than 10° but no more than 50°. More preferable contact angle is not less than 20° but no more than 40°. In case of a contact angle of less than 10°, the applied fluid may spread by wetting so that the pattern may be formed even on the hydrophobic organic layer 9. In case of a contact angle of more than 50°, the surface free energy is low so that the hydrophilic portion 13 may not be wetted with the fluid.

The source electrode 16 and the drain electrode 17 are obtained by applying a fluid to the flattening layer 2 made hydrophilic by surface modification.

It is necessary to select the fluid for use depending on the size of pattern. That is, for the fine line wire pattern such as that of the source electrode 16 and the drain electrode 17 and the like, a fluid using a hydrophobic solvent is used. Further, incase of a relatively large pattern, according to the contact angle of the hydrophilic portion 13, any one of a hydrophilic solvent and a hydrophobic solvent may be selected and used as the solvent for the fluid. In the case of forming the source electrode 16 and the drain electrode 17, a conductive polymer, colloidal metal, organic metal, or the like is used.

In case of using the electrode as the source electrode 16 and the drain electrode 17, of the electrode materials nominated above, those having a small electric resistance at a contact surface with the semiconductor layer.

Specifically, they are electrodes formed by use of a dispersion or solution of a conductive polymer, a slurry and paste of metal fine particles, a metal oxide or carbon black, a solution of an organic metal, or the like. Examples of the conductive polymer include poly(ethylenedioxythiophene)/poly(4-styrene sulphonic acid) and poly(p-aniline)/camphorsulfonic acid. Examples of the metal fine particle include silver and gold with a primary diameter of several tens nm, nano particles such as of nickel, and examples of the metal oxides include fine powder of zinc oxide, titanium dioxide, tin oxide, antimony oxide, indium oxide, bismuth oxide, tin-doped indium oxide, antimony-doped tin oxide, zirconium oxide, and the like. Examples of the organic metal include an organic acid salt of silver and the like. In order to disperse fine particles uniformly, it is possible to add a small amount of a surfactant or resin or to modify particle surfaces with organic molecules.

The conductive fine particles exist as aggregates such that conductive fine particles of a primary particle diameter of not less than 5 nm but less than 2 μm, for example, are deposited in contact with each other. In addition, the fine particles may be fusion-bonded or deposited densely.

Most of the electrode materials formed by application require a certain degree of heating for lowering the resistance, the heating temperature of not less than 120° C. but no more than 200° C. is preferable, in consideration of the use of a resin base material. The thickness of the electrode depends on the resistivity of the conductive material used, but is preferably not less than 30 nm but no more than 2 μm, in consideration of step coverage at the time of stacking as well as sheet resistivity.

In addition, as the application method of the fluid, there are preferably included dip coating, roll coating, an ink jet method, spin coating, cast coating, spray coating, doctor blade coating, dye-coating, a printing method, micro-contact printing, and the like. A suitable method is selected from these coating methods appropriately in consideration of the compatibility with the organic semiconductor thin film in accordance with the present invention. The dip coating and the like are suitable for forming a relatively large pattern on a large-area substrate at low cost. In this case, although the substrate is dipped, the large difference in the contact angle of the hydrophilic portion and the hydrophobic portion makes it possible to provide a minute pattern. Further, because the substrate having sufficient smoothness is employed, no blurring due to protuberances or the like will not occur.

Moreover, in order to form a minute pattern such as the source electrode 16 and the drain electrode 17, the ink jet method is suitable. This is because the fluid can be applied only to the latent image pattern of the hydrophilic portion. Moreover, the substrate of the present invention has sufficient smoothness so that blurring or the like due to protuberances will not occur.

So far, a part of the method of manufacturing an organic field effect transistor of the present invention has been described. In the case of the organic field effect transistor of the present invention, the constituent layers are prepared by a coating method or a printing method. This manufacturing method is suitable to a minute patter such as the source electrode 16, the drain electrode 17 and the like. In case of a relatively large pattern such as the gate electrode 14, the gate insulating layer 15 and the like, the method of the present invention may be used, but a simple method such as the printing method could be used.

In the case of the organic field effect transistor of the bottom contact structure, the source electrode 16 and the drain electrode 17 must be formed on the gate insulating layer 15 and the flattening layer 2. This point will be described with reference to FIG. 10 and FIGS. 11A to 11F. As for the source electrode 16 and the drain electrode 17, their patterns are formed on the flattening layer 2 and on the gate insulating layer 15 as shown in the sectional view of the organic field effect transistor of FIG. 10 (sectional view of an embodiment slightly different from the embodiment of FIGS. 8A and 8B). Incidentally, also at the end face of the gate insulating layer the source electrode 16 and the drain electrode 17 are formed. Patterns formed by a coating method or a printing method has a sectional shape with a moderate inclination. Therefore, in case of forming the gate insulating layer by a coating method or a printing method, such a phenomenon hardly occurs in which electrodes are the end face.

FIGS. 11A to 11D are views explaining pattern formation of the source electrode 16 and the drain electrode 17 after the patterning of the gate electrode 14 and the gate insulating layer 15. The basic forming method is the same as the method of pattern formation of the source electrode 16 and the drain electrode 17 on the flattening layer 2. However, because the pattern formation on the gate insulating layer 15 is formation of a pattern with a stack structure, this will be mainly described.

Figure 11A:
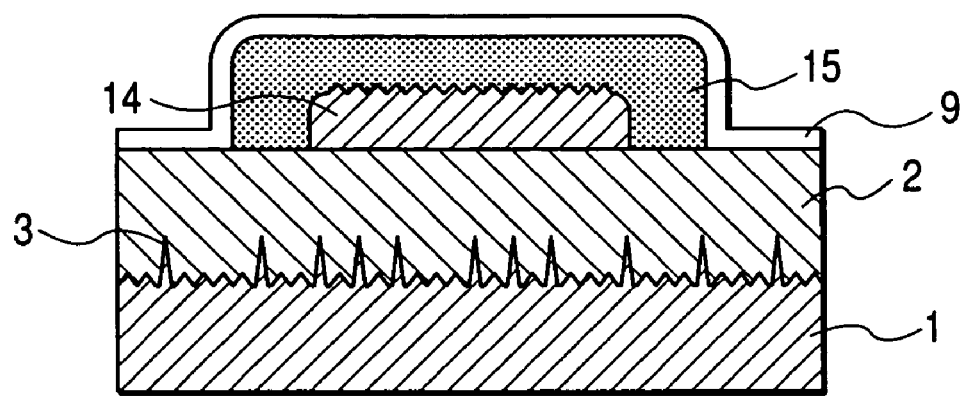
FIGS. 11A, 11B, 11C, 11D, 11E and 11F are conceptual views showing an example of forming steps of the organic field effect transistor in accordance with the present invention.

FIG. 11A shows that a hydrophobic organic layer 9 is coated on a flattening layer 2 and a gate insulating layer 15. The hydrophobic organic layer 9 used here is the same as the one used when forming the source electrode 16 and the drain electrode 17 on the flattening layer 2 above. For example, a fluororesin is included. Because the end face of the gate insulating layer 15 is a moderate slope, the end face of the gate insulating layer 15 can also be coated with the hydrophobic organic layer 9 uniformly.

The surface roughness of the gate insulating layer 15 is also an important factor for forming a minute pattern as with on the flattening layer 2.

It is preferred that the gate insulating layer 15 has such smoothness that the average surface roughness (Ra') is not more than 2 nm. With a surface roughness of more than 2 nm, a pattern with a minute end face pattern may not be formed.

Figure 11B:
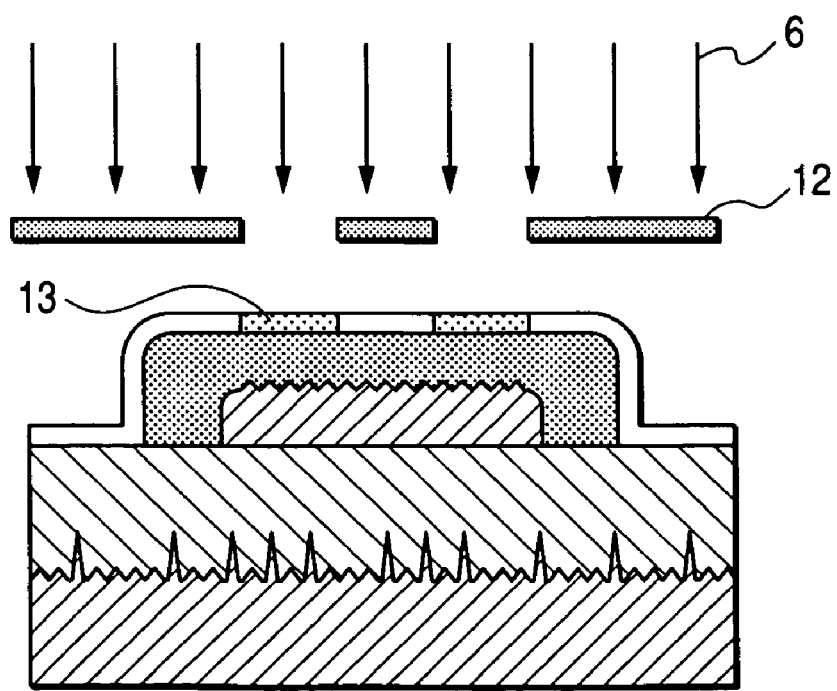
Figure 11C:
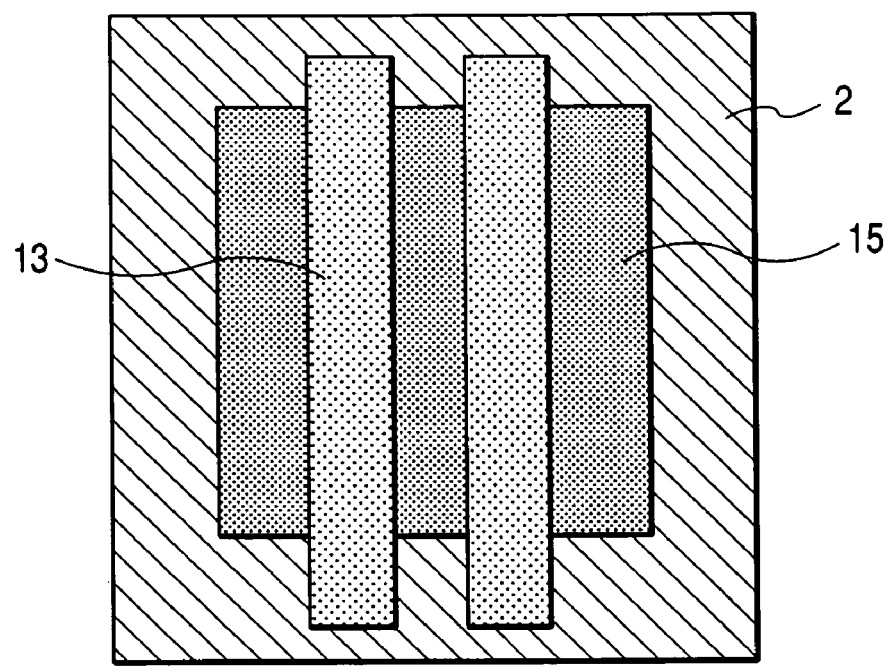

Next, as shown in FIGS. 11B and 11C, the hydrophobic organic layer 9 and the gate insulating layer 15 are partly subjected to surface modification to be made hydrophilic. This procedure may be the same as that when forming the pattern on the flattening layer 2 above. The appropriate surface modification means is irradiation with ultraviolet light of a wavelength of 150 nm to 350 nm. Especially, ultraviolet light of a wavelength of 200 nm or less has a high energy and can effect the surface modification in a short period of time, so that the exposure time can be shortened. Therefore, a latent image can accurately be obtained even with a minute pattern. Here, because the end face of the gate insulating layer 15 is a moderate slope, the quantity of diffracted light is small, so that the end face can also be subjected to surface modification with the pattern of the photomask 12 as a latent image. Moreover, when the photomask 12 and the body to be treated (the substrate having the hydrophobic organic layer 9 formed thereon) are brought into close contact with hard contact, the influence of the diffracted light can be made smaller.

The difference between the water contact angle of the hydrophilic portion 13 and the water contact angle of the hydrophobic organic layer 9 is an important indicator to obtain a minute pattern such as the source electrode 16 and the drain electrode 17 on the gate insulating layer. The contact angle difference here refers to the difference between the contact angle of the gate insulating layer 15 subjected to the surface modification and the contact angle of the hydrophobic organic layer 9. If this contact angle difference is not sufficient, the fluid applied to the hydrophilic portion 13 is applied also to the water-repellent part (i.e., the hydrophobic organic layer) 9, making it impossible to obtain a minute pattern. The preferable contact angle difference to obtain a minute pattern at this time is as described above.

In addition, in order to obtain the minute patterns such as the source electrode 16 and the drain electrode 17, the surface free energy itself of the hydrophilic portion 13 is important, which is also as described above.

The insulating material of the gate insulating layer 15 with a small surface roughness suitable for the surface modification includes a phenolic resin, silsesquioxane, and the like.

The hardened substance of the organic resin preferable as the gate insulating layer 15 of the organic field effect transistor of the present invention is a hardened substance of a phenolic resin represented by the general formula (1):

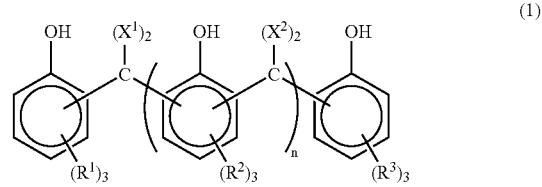

wherein, $R^1$, $R^2$ and $R^3$ are independently at least one selected from the group consisting of a hydrogen atom, a halogen atom, a hydroxymethyl group, and alkyl, alkenyl, alkynyl, alkoxyl, alkylthio, and alkyl ester groups each having 1 to 12 carbon atoms; $X^1$ and $X^2$ are independently at least one selected from the group consisting of a hydrogen atom, and alkyl, alkenyl, alkynyl, and aryl groups each having 1 to 12 carbon atoms; and n is an integer of 0 to 2,000, preferably 1 to 500.

As examples of the phenolic resin represented by the general formula (1) used in the present invention, there my be used novolac resins such as phenol novolac resin, o-cresol novolac resin, bisphenol A novolac resin and copolymer phenol novolac resins obtained by using a plurality of phenolic components, or resole type phenolic resin and dibenzylether type phenolic resin having reactive cross-linking groups such as methylol groups or dimethylol groups and the like. In addition, modified novolac resins obtained by modifying novolac resins with oil or the like can be used. Among them, novolac resins are preferred and are advantageous in high film strength after baking, and the like.

The softening point of the phenolic resin used in the present invention is preferably 70 to 130° C. and more preferably 80 to 120° C. With a softening point being less than 70° C., the strength after hardening is insufficient, while when exceeding 130° C., the reflow at the time of heat hardening is not sufficient so that the unevenness of the electrode surface cannot be smoothened.

In addition, using a cross-linking agent in combination with the phenolic resin can improve the film strength after hardening.

The method of manufacturing an FET of the present invention is characterized by including the step of applying a thermosetting resin composition comprising the phenolic resins represented by the general formula (1) and then effecting heating to form an insulating layer.

The thermosetting resin composition contains the phenolic resin represented by the general formula (1), a cross-linking agent, a catalyst, a solvent, and the like.

The content of the phenolic resin represented by the general formula (1) in the thermosetting resin composition is preferably 0.5 to 50% by weight, and more preferably 1 to 40% by weight.

The cross-linking agent used in combination with the phenolic resin includes those having two or more functionalities such as an epoxy compound, an oxetane compound, an isocyanate compound, a methylol compound, an acetylated methylol compound, a melamine cross-linking agent and a substituted urea cross-linking agent and the like. Among them, a melamine cross-linking agent and a substituted urea cross-linking agent are preferable and examples include compounds of methoxymethylated glycoluril, methoxymethylmelamine, and methylolmelamine and the like. Tetramethoxymethyl glycoluril and hexamethoxymethylmelamine are particularly preferable.

The addition amount of the cross-linking agent is 10 to 200 parts by weight for 100 parts by weight of the phenolic resin. With an addition amount of less than 10 parts by weight, the hardening time is too long, while when exceeding 200 parts by weight, unreacted cross-linking moiety exists too much to possibly deteriorate the characteristics of the film. However, in the case where the whole or a part of $R^1$, $R^2$ and $R^3$ of the phenolic resin represented by the general formula (1) are a reactive cross-linking group such as a hydroxymethyl group and the like, a sufficiently hardened film is obtained without the addition of the cross-linking agent to the phenolic resin.

In order to effectively cross-link the resin with the cross-linking agent, a catalyst may additionally be used.

The catalyst for use in combination with the phenolic resins can be selected from an acid catalyst, a basic catalyst, a quaternary onium salt, and the like depending on the cross-linking agent used. For example, in case of using hexamethoxymethylmelamine as the cross-linking agent, carboxylic acids such as formic acid, acetic acid, oxalic acid, etc. and sulfonic acids such as p-toluenesulfonic acid, camphorsulfonic acid, etc., are used as the acid catalyst, but sulfonic acid such as p-toluenesulfonic acid and camphorsulfonic acid are preferably used. In order to improve the stability in a solution as well as to decrease the hardening speed to improve the flattening property, sulfonic acid amine salts can also be used. The sulfonic acid amine salts include p-toluenesulfonic acid pyridine salt.

As the solvent to dissolve the resin and the like, there may be used ethylene glycol monomethyl ether, methyl cellosolve acetate, diethylene glycol monomethyl ether, propylene glycol, propylene glycol monomethyl ether, propylene glycol monomethyl ether acetate, toluene, xylene, methyl ethyl ketone, cyclohexanone, 2-hydroxypropionic acid ethyl, butyl acetate, ethyl lactate, butyl lactate, butyl alcohol, ethyl alcohol, ethyl alcohol, isopropyl alcohol, and the like. These organic solvents may be used singularly, or in combination of two or more.

Among the solvents, butyl acetate, ethyl lactate, butyl lactate, butyl alcohol, ethyl alcohol, isopropyl alcohol and the like are preferable from the point of view of improving leveling performance and patterning performance of the gate insulating film 15.

The solid content of the thermosetting resin composition in the present invention is controlled depending on a desired film thickness freely, but is preferably 1 to 50% by weight.

In addition, as another insulating material suitable for the gate insulating layer 15 of the organic field effect transistor of the present invention, a compound having a particular silsesquioxane skeleton represented by the following general formula (2) is preferably contained in the construction to improve the insulating performance.

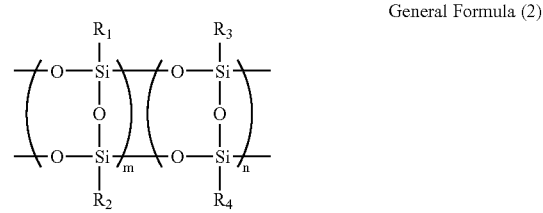

General Formula (2)

In the general formula (2), $R_1$, $R_2$, $R_3$, and $R_4$ are independently unsubstituted or substituted alkyl group having 1 to 5 carbon atoms, or unsubstituted or substituted phenyl group; and m and n are independently an integer of 0 or more, and the sum of m and n is an integer of 1 or more.

This material having the particular siloxane skeleton is a substituent comprising a main chain having an inorganic siloxane unit and a side chain having carbon atoms. That is, by using an organic/inorganic hybrid ladder type skeleton as a major component of the gate insulating film, a minute and highly insulating thin film is obtained even with low-temperature drying treatment. The term "ladder type" herein employed is intended to mean that the number of branch points is small (i.e., slightly branched), which is the same meaning as generally used in the art. The structure represented by the general formula (2) shows a silsesquioxane skeleton having an extremely small number of branch points.

When the skeleton is of the ladder type, the void in the film is reduced compared with randomly branched silsesquioxane to thereby improve the denseness.

Further, the substituents $R_1$ to $R_4$ having carbon atoms corresponding to side chains of the silsesquioxane skeleton in the present invention are the same or different and are unsubstituted or substituted alkyl group having 1 to 5 carbon atoms, or unsubstituted or substituted phenyl group. For example, unsubstituted alkyl group such as methyl group or ethyl group, unsubstituted phenyl group, and substituted phenyl group such as dimethyl phenyl group or naphthyl group are included. In addition, the substituents $R_1$ to $R_4$ may further contain various kinds of atoms such as oxygen atom, nitrogen atom or metal atom other than carbon atoms and hydrogen atoms, but substituents containing halogen atoms are not preferable since they will become a cause for lowering insulation property.

The silsesquioxane skeleton in the present invention will be described. The general formula (2) shows a structural formula in which repetition of m units of silsesquioxane having substituents $R_1$ and $R_2$ (hereinafter referred to as first unit) and repetition of n units of silsesquioxane having substituents $R_3$ and $R_4$ (hereinafter referred to as second unit) are connected (m and n are independently an integer of 0 or more and m+n is an integer of 1 or more), which, however, does not mean that the repetition of the first unit and the repetition of the second unit are separate. The both units may either be connected separately or in a random mixture.

In order to form the gate insulating layer 15 using as a major content a compound having the particular silsesquioxane skeleton represented by the general formula (2), a solution containing polyorganosilsesquioxane compound represented by the general formula (3) and/or the general formula (4) shown below may be applied, followed by pattern formation.

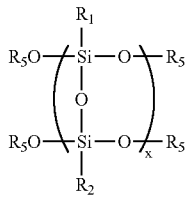

General Formula (3)

In the general formula (3), $R_1$ and $R_2$ are independently unsubstituted or substituted alkyl group having 1 to 5 carbon atoms, or unsubstituted or substituted phenyl group. $R_5$ is an alkyl group having 1 to 4 carbon atoms or a hydrogen atom, and x is an integer of 1 or more.

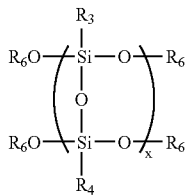

General Formula (4)

In the general formula (4), $R_3$ and $R_4$ are independently unsubstituted or substituted alkyl group having 1 to 5 carbon atoms, or unsubstituted or substituted phenyl group. $R_6$ is an alkyl group having 1 to 4 carbon atoms or a hydrogen atom, and y is an integer of 1 or more.

The heating treatment is performed at a temperature of 220° C. or less. With this heating, a polymerization reaction proceeds at the ends of the compounds so that the silsesquioxane compounds as a source material are brought into connection in the ladder form to be densified and to develop insulation property. However, at this time, because the drying temperature is not so high as to completely extinguish the organic substance, the source compound will not completely form the silica structure but will form silsesquioxane skeleton where most of the substituents remain. More preferable heating treatment temperature is not less than 140° C. but no more than 180° C. Heating at less than 140° C., polymerization reaction might be insufficient. Heating at more than 220° C., a resin substrates might be damaged.

In addition, for the purpose of supplementing the reaction in which the silsesquioxane compounds as oligomers are cross-linked with each other during the drying step, an acid such as formic acid may be added in a small amount to the coating solution.

The addition amount of the acid is not limited in particular, but in the case of formic acid, addition within the range of 1% to 30% on the basis of the weight of solid matter of the polyorganosilsesquioxane compound contained in the coating solution will promote the cross-linking reaction. If the addition amount is less than 1% by weight, the effect of promoting the cross-linking reaction is not sufficient, and on the contrary, if the addition amount is more than 30% by weight, the insulation property of the film after drying might be impaired.

Since the cross-linking reaction and the removal of the solvent are implemented at a low temperature of not more than 220° C., the stabilizer not brought into evaporation, volatilization or burning out is removed from the solution system as much as possible.

As the solvent of the coating solution, any solvent such as alcohols and esters, etc., can be used. Moreover, the solvent may suitably be selected taking the wettability to the substrate or the like into consideration.

Figure 10:
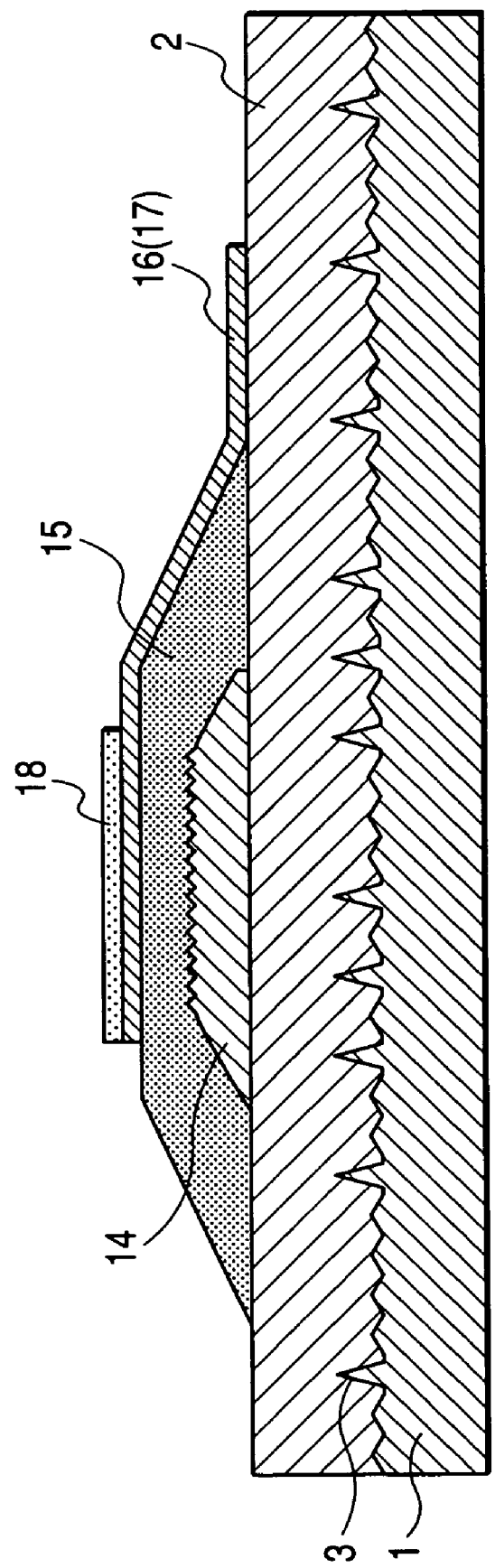
FIG. 10 is a conceptual sectional view showing an example of the organic field effect transistor in accordance with the present invention.
Figure 11D:
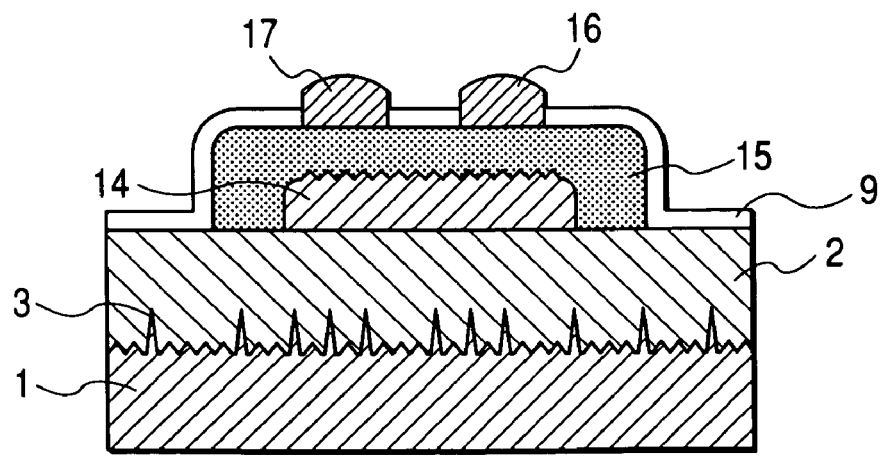
Figure 11E:
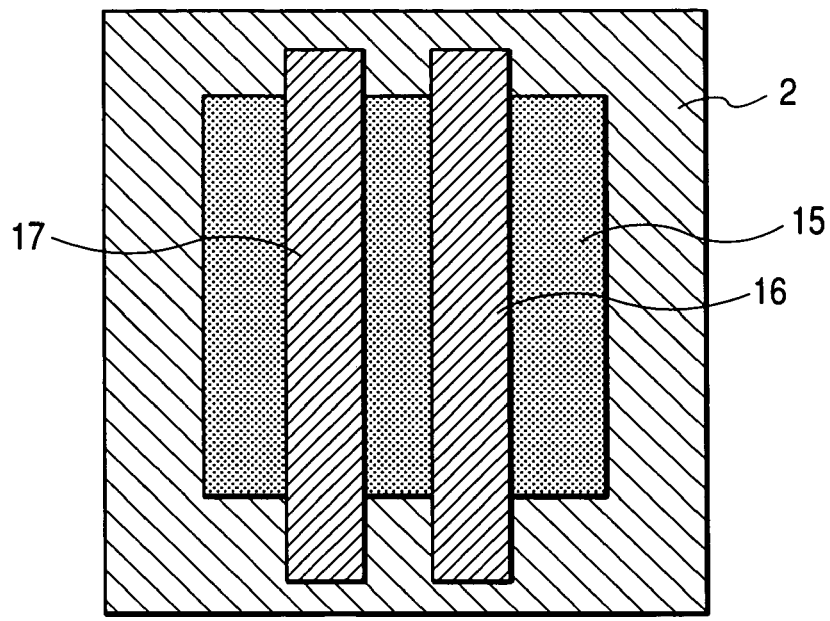
Figure 11F:
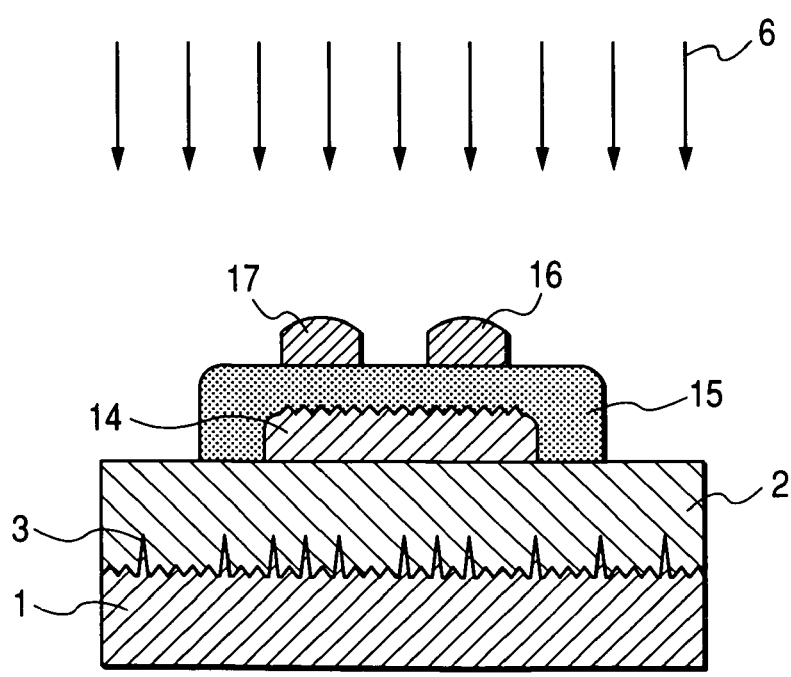

Next, as shown in FIGS. 11D and 11E, an electrode material is applied to the hydrophilic portion 13 of the flattening layer 2 and gate insulating layer 15 to form the source electrode 16 and the drain electrode 17. As shown in FIG. 10 and FIG. 11E, the source electrode 16 and the drain electrode 17 are preferably formed so as to extend from the flattening layer 2 to the gate insulating layer 15.

In this case, the thickness and the sectional shape of the gate insulating layer 15 are important. Because the end face of the gate insulating layer 15 has a moderate inclination and a hydrophilic region 13 pattern which is the same as the pattern of the photomask 12 as a latent image is formed, the minute source electrode 16 and drain electrode 17 can be formed also at this end face by application. In addition, when the total film thickness of the gate insulating layer 15 and the gate electrode 14 is not more than 1.2 μm, the minute source electrode 16 and drain electrode 17 can be formed by application, which is preferable. The total thickness of 0.4 μm to 0.8 μm is more preferable. In case of more than 1.2 μm, since the film thickness is large, the source electrode 16 and drain electrode 17 could not be pattern formed at the end parts by application.

Thus, an organic field effect transistor can be provided in which a flattening layer and a gate insulating layer having a small average surface roughness and capable of easy control of a surface free energy are formed by application.

Incidentally, the present invention will not be limited to the embodiments, but can undergo various modifications based on the intensions of the present invention, and these will not be excluded from the scope of the present invention.

EXAMPLES

The present invention will be described specifically with reference to examples thereof.

<Cleaning of Resin Base Material 1>

A polyethylene terephthalate (PET) film (made by Teijin DuPont Films Japan Limited) with a thickness of 188 μm was cleaned with acetone and isopropyl alcohol and dried. The surface roughness of this resin base material was measured with a scanning probe microscope (made by Seiko Instruments Inc., SPI3800) and a stylus type difference in level/surface form measurement equipment (made by KLA-TENCORE, TENCORE P-10). The average surface roughness (Ra') of this resin base material was 5 nm, and the maximum peak height was 0.3 μm. The water contact angle of the base material surface was measured with an automatic dynamic contact angle meter (made by Kyowa Interface Science Co., LTD., trade name DCA-WZ) to be 74°.

<Cleaning of Resin Base Material 2>

A polyethylene naphthalate (PEN) film (made by DU PONT-TORAY CO., LTD.) with a thickness of 125 μm was cleaned with acetone and isopropyl alcohol and dried. The surface roughness of this resin base material was measured as with the resin base material 1, with the result that the average surface roughness (Ra') was 5 nm, and the maximum peak height was 0.3 μm. The water contact angle of the base material surface was 74°.

<Cleaning of Resin Base Material 3>

A polyethylene terephthalate (PET) film (made by Teijin DuPont Films Japan Limited) with a thickness of 188 μm was cleaned with acetone and isopropyl alcohol and dried. The surface roughness of this resin base material was measured as with the resin base material 1, with the result that the average surface roughness (Ra') of this resin base material was 4 nm, and the maximum peak height was 0.3 μm.

<Cleaning of Resin Base Material 4>

A polyethylene naphthalate (PEN) film (made by DU PONT-TORAY CO., LTD.) with a thickness of 125 μm was cleaned with acetone and isopropyl alcohol and dried. The surface roughness of this resin base material was measured as with the resin base material 1, with the result that the average surface roughness (Ra') was 4.5 nm, and the maximum peak height was 0.25 μm.

<Cleaning of Resin Base Material 5>

A polyethylene naphthalate (PEN) film (made by DU PONT-TORAY CO., LTD.) with a thickness of 125 μm was cleaned with acetone and isopropyl alcohol and dried. The surface roughness of this resin base material was measured as with the resin base material 1, with the result that the average surface roughness (Ra') was 7 nm, and the maximum peak height was 0.25 μm.

<Cleaning of Resin Base Material 6>

A polyimide (PI) film (made by Teijin DuPont Films Japan Limited) with a thickness of 175 μm was cleaned with acetone and isopropyl alcohol and dried. The surface roughness of this resin base material was measured likewise the resin base material 1, with the result that the average surface roughness (Ra') of this substrate was 6 nm, and the maximum peak height was 0.35 μm.

<Cleaning of Resin Base Material 7>

A polyimide (PI) film (made by Teijin DuPont Films Japan Limited) with a thickness of 175 μm was cleaned with acetone and isopropyl alcohol and dried. The surface roughness of this resin base material was measured as with the resin base material 3, with the result that the average surface roughness (Ra') of this substrate was 5 nm, and the maximum peak height was 0.35 μm.

<Preparation of Organic Resin Solution 1>

19.5 g of phenol novolac resin (made by SUMITOMO BAKELITE Co., Ltd., trade name PR-53195) and 10.5 g of hexamethoxymethylmelamine resin (made by MITSUI-SCITEC CORP., trade name Cymel 303) were dissolved completely in a mixed solvent of 42.0 g of propylene glycol monomethyl acetate (hereinafter referred to as PGMEA) and 27.6 g of propylene glycol monomethyl ether (hereinafter referred to as PGME) at room temperature. After adding 0.75 g of 40% by weight 2-propanol solution (made by MITSUI-SCITEC CORP., trade name Catalyst 4040) as catalyst into the obtained solution, a PTFE-membrane filter of Φ 0.2 μm was used for filtration so as to prepare the organic resin solution 1.

<Preparation of Organic Resin Solution 2>

17.1 g of phenol novolac resin (made by SUMITOMO BAKELITE Co., Ltd., trade name PR-53195) and 12.9 g of tetramethoxymethyl glycolurea resin (made by MITSUI-SCITEC CORP., trade name Powderlink 1174) were dissolved completely in a mixed solvent of 42.9 g of PGMEA and 27.6 g of PGME at room temperature. After adding 0.75 g of 2-propanol solution (Catalyst 4040) into the obtained solution, a PTFE-membrane filter of Φ 0.2 μm was used for filtration so as to prepare the organic resin solution 2.

<Preparation of Organic Resin Solution 3>

16.0 g of phenol novolac resin (made by SUMITOMO BAKELITE Co., Ltd., trade name PR-53195), 7.0 g of epoxy resin (made by Asahi Denka Co., Ltd., trade name EP5100R) and 7.0 g of tetramethoxymethyl glycolurea resin (made by MITSUI-SCITEC CORP., trade name Powderlink 1174) were dissolved completely in a mixed solvent of 42.9 g of PGMEA and 27.6 g of PGME at room temperature. After adding 0.75 g of 2-propanol solution (Catalyst 4040) into the obtained solution, a PTFE-membrane filter of Φ 0.2 μm was used for filtration to prepare the organic resin solution 3.

<Preparation of Organic Resin Solution 4>

21.0 g of oil-soluble novolac resin (made by SUMITOMO BAKELITE Co., Ltd., trade name PR-219) and 9.0 g of hexamethoxymethylmelamine resin (made by MITSUI-SCITEC CORP., trade name Cymel 303) were dissolved completely in 69.4 g of PGMEA at room temperature. After adding 0.94 g of 2-propanol solution (Catalyst 4040) into the obtained solution, a PTFE-membrane filter of Φ 0.2 μm was used for filtration to prepare the organic resin solution 4.

<Preparation of Organic Resin Solution 5>

10 g of Polycarbonate resin (made by MITSUBISHI GAS CHEMICAL COMPANY, INC., trade name Z-200) was dissolved completely in 90.0 g of cyclohexanone at room temperature. The obtained solution was filtered with a PTFE-membrane filter of Φ 0.2 μm to prepare the organic resin solution 5.

<Preparation of Organic Resin Solution 6>

19.5 g of Phenol novolac resin (made by SUMITOMO BAKELITE Co., Ltd., trade name PR-53195) and 10.5 g of tetramethoxymethyl glycolurea resin (made by MITSUI-SCITEC CORP., trade name Powderlink 1174) were dissolved completely in 69.6 g of propylene glycol monomethyl ether acetate (PGMEA) at room temperature. After adding 0.75 g of 40% by weight 2-propanol solution (made by MITSUI-SCITEC CORP., trade name Catalyst 4040) as acid catalytic into the obtained solution, a PTFE-membrane filter of Φ 0.2 µm was used for filtration to prepare the organic resin solution 6.

<Preparation of Organic Resin Solution 7>

24.5 g of phenol novolac resin (made by SUMITOMO BAKELITE Co., Ltd., trade name PR-219) and 10.5 g of hexamethoxymethylmelamine resin (made by MITSUI-SCITEC CORP., trade name Cymel 303) were dissolved completely in 63.5 g of propylene glycol monomethyl ether acetate (PGMEA) at room temperature. After adding 2.14 g of 40% by weight 2-propanol solution (made by MITSUI-SCITEC CORP., trade name Catalyst 4050) as acid catalytic into the obtained solution, a PTFE-membrane filter of 0.2 µm was used for filtration to prepare the organic resin solution 7.

<Preparation of Organic Resin Solution 8>

9.5 g of phenol novolac resin (made by SUMITOMO BAKELITE Co., Ltd., trade name PR-53195) and 10.5 g of tetramethoxymethyl glycolurea resin (made by MITSUI-SCITEC CORP., trade name Powderlink 1174) were dissolved completely in 69.6 g of propylene glycol monomethyl ether acetate (PGMEA) at room temperature. After adding 0.75 g of 40% by weight 2-propanol solution (made by MITSUI-SCITEC CORP., trade name Catalyst 4040) as acid catalytic into the obtained solution, a PTFE-membrane filter of Φ 0.2 µm was used for filtration to prepare the organic resin solution 8.

<Preparation of Organic Resin Solution 9 (for Gate Insulating Layer)>

5.9 g of phenol novolac resin (number average molecular weight 770, molecular weight distribution 1.5, softening point 108° C.) and 4.1 g of hexamethoxymethyl melamine cross-linking agent (made by MITSUI-SCITEC CORP., trade name Cymel 303) were dissolved completely in a mixed solvent of 54 g of propylene glycol monomethyl ether acetate (hereinafter to be referred to as PGMEA) and 45.7 g of propylene glycol monomethyl ether (hereinafter to be referred to as PGME) at room temperature. After adding 0.5 g of 40% by weight 2-propanol solution (made by MITSUI-SCITEC CORP., trade name Catalyst 4040) as acid catalytic into the obtained solution, a PTFE-membrane filter of Φ 0.2 µm was used for filtration to prepare thermosetting resin composition 1.

<Preparation of Organic Resin Solution 10 (for Gate Insulating Layer)>

In a mixed solvent consisting of 46.5 g of ethanol, 46.5 g of 1-butanol, 7.0 g of commercially available flake-shaped methylsilsesquioxane (MSQ) (made by SHOWA DENKO K.K., trade name GR650) was dissolved to prepare a solution of a concentration of 7% by weight. Here, for the purpose of promoting the cross-linking reaction, 0.7 g of formic acid was added.

<Preparation of Organic Resin Solution 11 (for Interface Treatment Layer)>

In a mixed solvent consisting of 49.5 g of ethanol, 49.5 g of 1-butanol, 1.0 g of commercially available flake-shaped methylsilsesquioxane (MSQ) (made by SHOWA DENKO K.K., trade name GR650) 1.0 g was dissolved to prepare a solution with a concentration of 1% by weight.

<Production of Substrate 1>

The organic resin solution 6 was coated onto the resin base material 3 with a dip coater, and thereafter was heated in a hot-air circulating oven at 180° C. for an hour.

No cracks and the like were observed on the formed organic resin layer surface through visual observation. The water contact angle of the substrate surface was measured with an automatic dynamic contact angle meter DCA-WZ (made by Kyowa Interface Science Co., LTD.) and was 63°. The surface shape of the obtained substrate similar to the resin base material 3 was observed to see that the average surface roughness (Ra') of this substrate was 0.3 nm and the maximum peak height was 3 nm.

<Production of Substrate 2>

The organic resin solution 7 was coated onto the resin base material 3 with a dip coater, and thereafter was heated in a hot-air circulating oven at 180° C. for an hour.

No cracks and the like were observed on the formed organic resin layer surface through visual observation. The water contact angle of the substrate surface was measured as with the substrate 1 and was 72°. In addition, the average surface roughness (Ra') of this substrate was 0.4 nm and the maximum peak height was 4 nm.

<Production of Substrate 3>

The organic resin solution 6 was coated onto the resin base material 4 with a dip coater, and thereafter was heated in a hot-air circulating oven at 180° C. for an hour.

No cracks and the like were observed on the formed organic resin layer surface with visual observation. The water contact angle of the substrate surface was measured as with the substrate 1 and was 65°. In addition, the average surface roughness (Ra') of this substrate was 0.3 nm and the maximum peak height was 3 nm.

<Production of Substrate 4>

The organic resin solution 7 was coated onto the resin base material 4 with a dip coater, and thereafter was heated in a hot-air circulating oven at 180° C. for an hour.

No cracks and the like were observed on the formed organic resin layer surface with visual observation. The water contact angle of the substrate surface was measured as with the substrate 1 and was 73°. In addition, the average surface roughness (Ra') of this substrate was 0.4 nm and the maximum peak height was 4 nm.

<Production of Substrate 5>

The organic resin solution 8 was coated onto the resin base material 3 with a dip coater, and thereafter was heated in a hot-air circulating oven at 180° C. for an hour.

No cracks and the like were observed on the formed organic resin layer surface with visual observation. The water contact angle of the substrate surface was measured as with the substrate 1 and was 68°. In addition, the average surface roughness (Ra') of this substrate was 1 nm and the maximum peak height was 45 nm.

<Production of Substrate 6>

The organic resin solution 6 was coated onto the resin base material 3 with a dip coater, and thereafter was heated in a hot-air circulating oven at 95° C. for three hours.

No cracks and the like were observed on the formed organic resin layer surface with visual observation. The water contact angle of the substrate surface was measured as in the substrate 1 and was 64°. In addition, the average surface roughness (Ra') of this substrate was 1.5 nm and the maximum peak height was 10 nm.

<Production of Substrate 7>

The organic resin solution 1 was coated onto the resin base material 3 with a dip coater, and thereafter was heated in a hot-air circulating oven at 180° C. for an hour.

No cracks and the like were observed on the formed organic resin layer surface with visual observation. The water contact angle of the substrate surface was measured as in the substrate 1 and was 66°. In addition, the average surface roughness (Ra') of this substrate was 0.3 nm and the maximum peak height was 4 nm.

<Production of Substrate 8>

The organic resin solution 2 was coated onto the resin base material 3 with a dip coater, and thereafter was heated in a hot-air circulating oven at 180° C. for an hour.

No cracks and the like were observed on the formed organic resin layer surface with visual observation. The water contact angle of the substrate surface was measured as in the substrate 1 and was 66°. In addition, the average surface roughness (Ra') of this substrate was 0.3 nm and the maximum peak height was 4 nm.

Example 1

The organic resin solution 1 was coated onto a PET film with a dip coater, and thereafter was heated in a hot-air circulating oven at 180° C. for an hour to form an organic resin layer with a film thickness of 3 µm.

No cracks and the like were observed on the formed organic resin layer surface with visual observation. The water contact angle of the substrate surface was 63°. In addition, the surface resistivity of the organic resin layer surface was measured with a high-resistivity measuring device (made by Mitsubishi Chemical Corporation, trade name Hiresta UP MC P-HT450 [probe URS]), and was $1 \times 10^{13}$ Ω/□ or more at an applied voltage of 100 V. Moreover, the heat characteristic of the film obtained by heating the organic resin solution 1 was analyzed with differential scanning calorimeter, and no glass transition temperature (Tg) was observed at 180° C. or less.

The surface roughness of the obtained substrate was measured with a scanning probe microscope (made by Seiko Instruments Inc., SPI3800) and stylus type difference in level fine form measurement equipment (made by KLA-TENCORE, TENCORE P-10), with the result that the average surface roughness (Ra') of this substrate was 0.5 nm and the maximum peak height was 4 nm.

Figure 4:
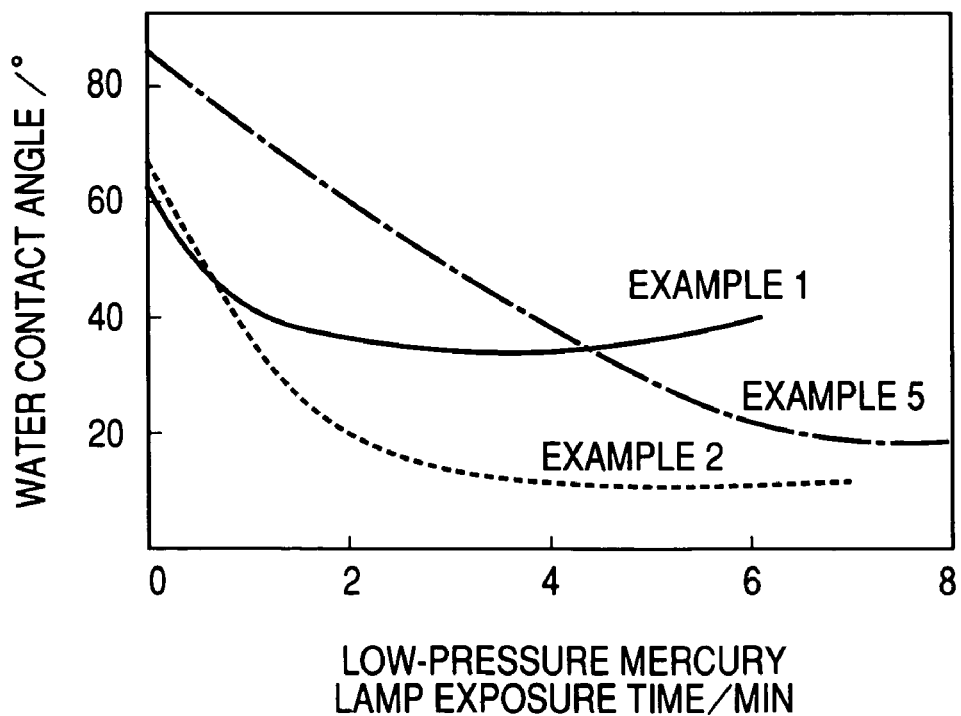
FIG. 4 is a graphical representation showing an example of change in water contact angle depending on ultraviolet exposure of a surface of an organic resin layer of the substrate in accordance with the present invention.

The substrate surface where the organic resin layer was formed was exposed to a low-pressure mercury lamp and changed in water contact angle thereof are shown in FIG. 4. After 3-minute exposure, the water contact angle of the substrate surface, the average surface roughness and the maximum height were respectively 38°, 0.5 nm and 4 nm, and only the water contact angle changed.

An organic silver compound (made by FUJIKURAKASEI CO., LTD., trade name DOTITE XA-9019) was coated onto the post-exposure substrate surface with a dipping method and calcination was effected in a hot-air circulating oven at 180° C. for an hour to form a silver foil with a film thickness of 300 nm. Afterwards, even when subjected to heating up to 180° C., no film separation and the like accompanied by thermal deformation was not observed. The surface resistivity of the silver foil subjected to the heating was measured with a low-resistivity measuring device (made by Mitsubishi Chemical Corporation, trade name Loresta GP MCP-T600 (probe ASP)) and was 0.12 Ω/□.

Example 2

With the exception that the organic resin solution 1 was replaced with the organic resin solution 2, the same procedure as in Example 1 was followed. On the surface of the formed organic resin layer with a film thickness of 2.8 µm, no cracks and the like were observed with visual observation, and the water contact angle and the surface resistivity at 100 V of the substrate surface were respectively 63° and not less than $1 \times 10^{13}$ Ω/□. Moreover, Tg of the film obtained by heating the organic resin solution 2 was not observed at 180° C. or less.

As with Example 1, surface roughness of the obtained substrate was measured and the average surface roughness (Ra') of the organic resin layer of this substrate was 0.3 nm and the maximum peak height was 3 nm.

Subject to 3-minute exposure with a low-pressure mercury lamp, the water contact angle of the substrate surface, the average surface roughness and the maximum height were measured and were respectively 22°, 0.3 nm and 3 nm, and only water contact angle changed. The silver foil with a film thickness of 300 nm formed using an organic silver compound (made by FUJIKURAKASEI CO., LTD., trade name DOTITE XA-9019) on the organic resin layer subjected to the exposure had a surface resistivity of 0.15 Ω/□ and no peeling and the like during calcination were observed. Incidentally, the substrate surface where the organic resin layer was formed was subjected to exposure with a low-pressure mercury lamp and changed in water contact angle thereof are shown in FIG. 4.

Example 3

With the exception that the organic resin solution 1 was replaced with the organic resin solution 3, the same procedure as in Example 1 was followed. On the surface of the formed organic resin layer with a film thickness of 3.6 µm, no cracks and the like were observed with visual observation, and the water contact angle and the surface resistivity at 100V both of the substrate surface were respectively 65° and not less than $1 \times 10^{13}$ Ω/□. Moreover, Tg of the film obtained by heating the organic resin solution 3 was not observed at 180° C. or less.

As with Example 1, the surface roughness of the obtained substrate was measured and the average surface roughness (Ra') of the organic resin layer of this substrate was 0.8 nm and the maximum peak height was 10 nm.

After 5-minute exposure with a low-pressure mercury lamp, the water contact angle of the substrate surface, the average surface roughness and the maximum height were measured and were respectively 20°, 0.8 nm and 10 nm, and only the water contact angle changed. The silver foil with a film thickness of 330 nm formed using an organic silver compound (made by FUJIKURAKASEI CO., LTD., trade name DOTITE XA-9019) on the organic resin layer subjected to the exposure had a surface resistivity of 0.22 Ω/□. No peeling and the like during calcination were observed.

Example 4

With the exception that the organic resin solution 1 was replaced with the organic resin solution 4, the same procedure as in Example 1 was followed. On the surface of the formed organic resin layer with a film thickness of 2.8 µm, no cracks and the like were observed with visual observation, and the water contact angle and the surface resistivity at 100 V of the substrate surface were respectively 72° and not less than $1 \times 10^{13}$ Ω/□. Moreover, Tg of the film obtained by heating the organic resin solution 4 was not observed at 180° C. or less.

As with Example 1, the surface roughness of the obtained substrate was measured and the average surface roughness (Ra') of the organic resin layer of this substrate was 0.4 nm and the maximum peak height was 6 nm. After 3-minute exposure with a low-pressure mercury lamp, the water contact angle of the substrate surface, the average surface roughness and the maximum height were measured and were respectively 38°, 0.4 nm and 6 nm, and only the water contact angle changed. The silver foil with a film thickness of 320 nm formed using an organic silver compound (made by FUJIKURAKASEI CO., LTD., trade name DOTITE XA-9019) on the organic resin layer subject to the exposure had a surface resistivity of 0.14 Ω/□. No peeling and the like during calcination were observed.

Example 5

With the exception that the organic resin solution 1 was replaced with the organic resin solution 5, the same procedure as in Example 1 was followed. On the formed organic resin layer surface, no cracks and the like were observed with visual observation, and the water contact angle and the surface resistivity at 100 V of the substrate surface were respectively 87° and not less than $1 \times 10^{13}$ Ω/□. Moreover, Tg of the film obtained by heating the organic resin solution 5 was observed at 180° C.

As with Example 1, the surface roughness of the obtained substrate was measured and the average surface roughness (Ra') of the organic resin layer of this substrate was 0.9 nm and the maximum peak height was 15 nm.

After 6-minute exposure with a super low-pressure mercury lamp, the water contact angle of the substrate surface, the average surface roughness and the maximum height were respectively 19°, 0.9 nm and 15 nm, and only the water contact angle changed. The silver foil with a film thickness of 320 nm formed using an organic silver compound (made by FUJIKURAKASEI CO., LTD., trade name DOTITE XA-9019) on the organic resin layer subjected to the exposure had a surface resistivity of 0.23 Ω/□. No peeling and the like during calcination were observed. Incidentally, the substrate surface where the organic resin layer was formed was brought into exposure with a low-pressure mercury lamp and changes in water contact angle thereof are shown in FIG. 4.

Example 6

With the exception that the resin base material was replaced with the PEN film, the same procedure as in Example 1 was followed. On the surface of the formed organic resin layer with a film thickness of 3 μm formed on the PEN, no cracks and the like were observed with visual observation, and the water contact angle and the surface resistivity at 100 V of the substrate surface were respectively 63° and not less than $1 \times 10^{13}$ Ω/□. As with Example 1, the surface roughness of the obtained substrate was measured and the average surface roughness (Ra') of the organic resin layer of this substrate was 0.5 nm and the maximum peak height was 4 nm.

After 3-minute exposure with a low-pressure mercury lamp, the silver foil with a film thickness of 470 nm formed using an organic silver compound solution on the organic resin layer had a surface resistivity of 0.20 Ω/□. No peeling and the like during calcination were observed.

Example 7

With the exception that the silver foil was formed from colloidal silver (made by NIPPON PAINT Co., Ltd., trade name Fine Sphere SVE102) instead of the organic silver compound (made by FUJIKURAKASEI CO., LTD., trade name DOTITE XA-9019), the same procedure as in Example 1 was followed. The colloidal silver was coated onto the post-exposure substrate surface uniformly and calcination was effected in a hot-air circulating oven at 150° C. for an hour. The silver foil with a film thickness of 220 nm was formed and surface resistivity was 0.15 Ω/□. No peeling and the like during calcination were observed.

Example 8

With the exception that the organic resin solution 1 was replaced with the organic resin solution 2, the same procedure as in Example 7 was followed. The silver foil with a film thickness of 320 nm formed using colloidal silver (made by NIPPON PAINT Co., Ltd., trade name Fine Sphere SVE102) on the organic resin layer subjected to the exposure had surface resistivity of 0.69 Ω/□. No peeling and the like during calcination were observed.

Example 9

With the exception that the conductive polymer film was formed with a conductive polymer water dispersion instead of forming silver foil, the same procedure as in Example 1 was followed. The poly(3,4-ethylene dioxythiophene) and poly (4-styrene sulphonic acid) particle water dispersion (made by H. C. Stark-V TECH Ltd., trade name Baytron P) was coated onto the post-exposure substrate surface uniformly and calcination was effected in a hot-air circulating at 150° C. for an hour. The conductive polymer film with a film thickness of 300 nm was formed and the surface resistivity was 3 kΩ/□. No peeling and the like during calcination were observed.

Example 10

With the exception that the resin base material was replaced with a PEN film, the same procedure as in Example 9 was followed. The conductive polymer film with a film thickness of 350 nm formed using a conductive polymer water dispersion (made by H. C. Stark-V TECH Ltd., trade name Baytron P) on the organic resin layer subjected to the exposure had a surface resistivity of 3.2 kΩ/□. No peeling and the like during calcination were observed.

Example 11

With the exception that the organic resin solution 1 was replaced with the organic resin solution 2, the same procedure as in Example 9 was followed. The conductive polymer film with a film thickness of 310 nm formed using a conductive polymer water dispersion (made by H. C. Stark-V TECH Ltd., trade name Baytron P) on the organic resin layer subjected to the exposure had a surface resistivity of 3.5 kΩ/□. No peeling and the like during calcination were observed.

Example 12

With the exception that the organic resin solution 1 was replaced with the organic resin solution 5, the same procedure as in Example 9 was followed. The conductive polymer film with a film thickness of 340 nm formed using a conductive polymer water dispersion (made by H. C. Stark-V TECH Ltd., trade name Baytron P) on the organic resin layer subjected to the exposure had a surface resistivity of 3.1 kΩ/□. No peeling and the like during calcination were observed.

Comparative Example 1

An organic silver compound (made by FUJIKURAKASEI CO., LTD., trade name DOTITE XA-9019) was coated onto the PET film with a dipping method and calcination was effected in a hot-air circulating oven at 180° C. for an hour.

A film with a thick part of a film thickness of 300 nm was obtained, but nonuniformity made of a silver gray color part and a brown color part was observed. The surface resistivity varied from 0.56 to 15 kΩ/□ depending on the location. No peeling and the like during calcination were observed.

Comparative Example 2

With the exception that the base material was replaced with a PEN film, the same procedure as in Comparative Example 1 was followed. A film with a thick part of a film thickness of 310 nm was obtained, but nonuniformity made of a silver gray color part and a brown color part was observed. The surface resistivity varied from 0.8 to 10 kΩ/□. No peeling and the like during calcination were observed.

Comparative Example 3

With the exception that the organic silver compound (made by FUJIKURAKASEI CO., LTD., trade name DOTITE XA-9019) was replaced with a colloidal silver (NIPPON PAINT Co., Ltd., trade name Fine Sphere SVE102), the same procedure as in Comparative Example 1 was followed. The silver foil film with a film thickness of 190 nm was formed, but flocculant was found to be generated. The surface resistivity was 24 kΩ/□. No peeling and the like during calcination were observed.

Comparative Example 4

With the exception that the organic silver compound DOTITE 9019 was replaced with a conductive polymer water dispersion (made by H. C. Stark-V TECH Ltd., trade name Baytron P), the same procedure as in Comparative Example 1 was followed. A conductive polymer film with a film thickness of 180 nm was formed, and the surface resistivity was 50 kΩ/□. No peeling and the like during calcination were observed.

Comparative Example 5

With the exception that heating was performed in a hot-air circulating oven at 120° C. for three hours, the same procedure as in Example 1 was followed.

On the formed organic resin layer surface, no cracks and the like were observed with visual observation. The water contact angle and the surface resistivity at 100 V of the substrate surface were respectively 58° and not less than $1 \times 10^{13}$ Ω/□. No glass-transition temperature (Tg) was observed at 180° C. or less.

As with Example 1, the surface roughness of the obtained substrate was measured and the average surface roughness (Ra') of this substrate was 2.1 nm and the maximum peak height was 45 nm.

After 3-minute exposure, the water contact angle of the substrate surface, the average surface roughness and the maximum height were respectively 35°, 2.1 nm and 45 nm, and only the water contact angle changed.

On the organic resin layer subjected to the exposure, a silver foil with a film thickness of 320 nm formed using the organic silver compound (made by FUJIKURAKASEI CO., LTD., trade name DOTITE XA-9019) was obtained, but nonuniformity made of a silver gray color part and a brown color part. The surface resistivity varied from 0.50 to 18 kΩ/□. No peeling during calcination was observed, but cracks were observed partially.

Example 13

A fluororesin (made by SEIMI CHEMICAL Co., Ltd., trade name SR2000) was coated onto the substrate 1 with a dip coater, and thereafter was heated in a hot-air circulating oven at 80° C. for 10 minutes to form a hydrophobic organic layer with a thickness of 10 nm. Thereafter, effecting 10-second exposure with an eximer lamp (with wavelength of 172 nm) through a metal mask to make a hydrophilic portion on the substrate 1. The metal mask used at that time had a line width of 50 μm and a line interval of 50 μm. At this time, the water contact angle of the hydrophilic portion was 21° and the water contact angle of hydrophobic portion was 120°. Polyethylene dioxythiophene/polystyrene sulfonic acid (made by H. C. Stark-V TECH Ltd., trade name Baytron P) was coated onto the substrate 1 having this hydrophilic portion with a dip coater. Heating was implemented in a hot-air circulating oven at 150° C. for 60 minutes. The shape of this fine structure was observed with an optical microscope, with the result that the line width was 51 μm, the line interval was 49 μm and the thickness was 150 nm.

Example 14

By following the same fine structure forming method as in Example 13, a fine structure of polyethylene dioxythiophene/polystyrene sulfonic acid was made on the substrate 2. The water contact angle of the hydrophilic portion was 22° and the water contact angle of hydrophobic part was 120°, and this fine structure had a line width of 52 μm and a line interval of 48 μm.

Example 15

By following the same fine structure forming method as in Example 13, a fine structure of polyethylene dioxythiophene/polystyrene sulfonic acid was made on the substrate 3. The water contact angle of the hydrophilic portion was 19° and the water contact angle of hydrophobic portion was 119°, and this fine structure had a line width of 53 μm and a line interval of 47 μm.

Example 16

By following the same fine structure forming method as in Example 13, a fine structure of polyethylene dioxythiophene/polystyrene sulfonic acid was made on the substrate 4. The water contact angle of the hydrophilic portion was 53° and the water contact angle of hydrophobic portion was 119°, and this fine structure had a line width of 51 μm and a line interval of 49 μm.

Example 17

By following the same fine structure forming method as in Example 13, a colloidal silver solution (NIPPON PAINT Co., Ltd., Fine Sphere) was coated on the substrate 1 with dipping, and was heated in a hot-air circulating oven at 180° C. for 30 minutes to form a fine structure. However, in the hydrophobic organic layer, the water contact angle of the hydrophilic portion was 19° and the water contact angle of the hydrophobic portion was 119°, and this fine structure had a line width of 54 μm and a line interval of 46 μm.

Example 18

By following the same fine structure forming method as in Example 13, an organic silver compound (made by FUJIKURAKASEI CO., LTD., DOTITE) was coated on the substrate 1 with dipping, and was heated in a hot-air circulating oven at 180° for 30 minutes to form a fine structure. However, in the hydrophobic organic layer, the water contact angle of the hydrophilic portion was 19° and the water contact angle of the hydrophobic portion was 119°, and this fine structure had a line width of 53 μm and a line interval of 47 μm.

Example 19

By following the same fine structure forming method as in Example 13, a fine structure of polyethylene dioxythiophene/polystyrene sulfonic acid was made on the substrate 2 with the exception that when forming a hydrophilic portion on the substrate 2, a low-pressure mercury lamp (with wavelength of 185 and 254 nm) was used. The water contact angle of the hydrophilic portion was 22° and the water contact angle of hydrophobic portion was 120°, and this fine structure had a line width of 54 μm and a line interval of 46 μm.

Example 20

By following the same fine structure forming method as in Example 13, methylsilsesquioxane (MSQ) (made by SHOWA DENKO K.K., trade name GR650) dissolved in an ethanol-1-butanol (weight ratio of 1:1) mixed solvent was coated on the substrate 1 with dipping to form a fine structure, with the exception that when forming a hydrophilic portion on the substrate 2, a low-pressure mercury lamp (with wavelength of 185 and 254 nm) was used. The water contact angle of the hydrophilic portion was 22° and the water contact angle of the hydrophobic portion was 120°, and this fine structure had a line width of 52 μm and a line interval of 48 μm.

Example 21

By following the same fine structure forming method as in Example 13, a fine structure of polyethylene dioxythiophene/polystyrene sulfonic acid was made on the substrate 1, with the exception that the metal mask used at that time had a line width of 40 μm and a line interval of 40 μm. The fine structure obtained at this time had a line width of 43 μm and a line interval of 37 μm.

Example 22

A hydrophilic portion pattern was made through the same steps as in Example 13 up to the exposure and hydrophilic portion formation. Polyethylene dioxythiophene/polystyrene sulfonic acid (made by H. C. Stark-V TECH Ltd., trade name Baytron P) was coated on the substrate 1 having this hydrophilic portion with an ink jet method. Heating was implemented in a hot-air circulating oven at 150° C. for 60 minutes. The shape of this fine structure was observed with an optical microscope, with the result that the line width was 53 μm and the line interval was 46 μm.

Comparative Example 5

By following the same fine structure forming method as in Example 13, a fine structure of polyethylene dioxythiophene/polystyrene sulfonic acid was made on the substrate 5. With this substrate, the water contact angle of the hydrophilic portion was 20° and the water contact angle of the hydrophobic portion was 114°, and this fine structure had a line width of 58 μm and a line interval of 42 μm, and no fine structure having clear edges were obtained.

Comparative Example 6

By following the same fine structure forming method as in Example 13, a fine structure of polyethylene dioxythiophene/polystyrene sulfonic acid was made on the substrate 6. The water contact angle of the hydrophilic portion was 18° and the water contact angle of the hydrophobic portion was 110°, and this fine structure had a line width of 59 μm and a line interval of 42 μm.

Example 23

<Step 1-1 (Application of Flattening Layer)>

The organic resin solution 6 was coated onto the resin base material 5 with a dip coater and thereafter heated in a hot-air circulating oven at 180° C. for an hour.

No cracks and the like were observed on the formed organic resin layer surface with visual observation. The water contact angle of the substrate surface was measured with an automatic dynamic contact angle meter DCA-WZ (made by Kyowa Interface Science Co., LTD.) and was 63°. The surface shape of the obtained substrate similar to the resin base material 1 was observed to see that the average surface roughness (Ra') of this flattening layer was 0.3 nm and the maximum peak height was 3 nm. In addition, the thickness of this flattening layer was 2.5μ.

<Step 1-2 (Application of Hydrophobic Organic Layer)>

A fluororesin (made by Fluoro Technology, trade name 1010THZ) was coated with a dip coater onto the resin base material 5 having the organic resin solution 6 coated thereon, and thereafter was heated in a hot-air circulating oven at 80° C. for 10 minutes. The water contact angle at this time was 118°.

<Step 1-3 (Gate Electrode Latent Image Forming Step)>

A latent image was made on the flattening layer by 120-second exposure to an eximer lamp ($\lambda$=172 nm) through a photomask of synthesized quart glass (made by ASAHI GLASS CO., LTD., trade name AQX). The photomask pattern used at this time was 100 μm square. In addition, the water contact angle of the hydrophilic portion at this time was 21°.

<Step 1-4 (Gate Electrode Formation)>

A colloid (NIPPON PAINT Co., Ltd., trade name Fine Sphere SVW102) was coated with dipping onto the silver resin substrate having a part of the flattening layer subjected to the surface modification, and thereafter heating was effected in a hot-air circulating oven at 180° C. for 30 minutes. The shape of this gate electrode was observed with an optical microscope, and was 102×100 μm.

<Step 1-5 (Hydrophobic Organic Layer Removal)>

The entire surface of the resin substrate having the gate electrode pattern on the flattening layer was subjected to 120-second irradiation with an eximer lamp (λ=172 nm). The water contact angle of the flattening layer at this time was 65°.

<Step 1-6 (Application of Hydrophobic Organic Layer)>

A fluororesin (made by Fluoro Technology, trade name 1010THZ) was coated with a dip coater on the resin substrate having the gate electrode pattern on the flattening layer, and thereafter was heated in a hot-air circulating oven at 80° C. for 10 minutes. At this time, the water contact angle of the flattening layer was 118° and the water contact angle of the gate electrode was 112°.

<Step 1-7 (Gate Insulating Layer Latent Image Forming Step)>

The resin substrate having the gate electrode pattern on the flattening layer having been coated with the hydrophobic organic layer was irradiated with an eximer lamp (λ=172 nm) through a photomask of synthesized quart glass (made by ASAHI GLASS CO., LTD., trade name AQX). The photomask pattern of the gate insulating layer at this time was 300 μm square, being such a pattern as to cover the gate electrode.

<Step 1-8 (Gate Insulating Layer Forming Step)>

The organic resin solution 9 was coated by dipping onto the resin substrate having a part of the flattening layer and the gate electrode subjected to the surface modification, and thereafter was heated in a hot-air circulating oven at 180° C. for 30 minutes. The shape of this gate electrode was observed with an optical microscope, and was 305×302 μm.

<Step 1-9 (Hydrophobic Organic Layer Removal)>

The entire surface of the resin substrate having the gate electrode pattern and the gate insulating layer pattern on the flattening layer was subjected to 120-second irradiation with an eximer lamp (λ=172 nm). At this time, the water contact angle of the flattening layer was 65° and the water contact angle of the gate insulating layer was 60°.

<Step 1-10 (Application of Hydrophobic Organic Layer)>

A fluororesin (made by Fluoro Technology, trade name 1010THZ) was coated with a dip coater onto the resin substrate having the gate electrode pattern and the gate insulating layer pattern on the flattening layer, and thereafter was heated in a hot-air circulating oven at 80° C. for 10 minutes. At this time, the water contact angle of the flattening layer was 118° and the water contact angle of the gate insulating layer was 115°.

<Step 1-11 (Source Electrode and Drain Electrode Layer Latent Image Forming Step)>

The resin substrate having the gate electrode pattern and the gate insulating pattern on the flattening layer coated with the hydrophobic organic layer was irradiated with an eximer lamp (λ=172 nm) through a photomask of synthesized quart glass (made by ASAHI GLASS CO., LTD., trade name AQX). At this time, the photomask pattern of the source electrode and the drain electrode was a line width of 20 μm and a line interval of 20 μm.

<Step 1-12 (Source Electrode and Drain Electrode Forming Step)>

An organic silver compound (made by FUJIKURAKASEI CO., LTD., DOTITE) was coated by dipping on the resin substrate having a part of the flattening layer and a part of the gate insulating film subjected to the surface modification, and thereafter was heated in a hot-air circulating oven at 180° C. for 45 minutes. The shape of this source electrode and the drain electrode was observed with an optical microscope, and had a line width of 21 μm and a line interval of 19 μm.

<Step 1-13 (Hydrophobic Organic Layer Removal)>

The entire surface of the resin substrate having the gate electrode pattern, gate insulating layer and source electrode, drain electrode pattern on the flattening layer and having the source electrode and the drain electrode pattern on the gate insulating layer was subjected to 100-second irradiation with an eximer lamp (λ=172 nm). At this time, the water contact angle of the gate insulating layer on the flattening layer was 25°.

<Step 1-14 (Application of Hydrophobic Organic Layer)>

A fluororesin (made by Fluoro Technology, trade name 1010THZ) was coated by a dip coater on the resin substrate having the gate electrode pattern, the gate insulating layer, the source electrode, the drain electrode pattern on the flattening layer, and having the source electrode and the drain electrode pattern on the gate insulating layer and thereafter was heated in a hot-air circulating oven at 80° C. for 10 minutes. The water contact angle of the flattening layer at this time was 118°.

<Step 1-15 (Organic Semiconductor Layer Latent Image Forming Step)>

The resin substrate having the gate electrode pattern, gate insulating layer and the source electrode and the drain electrode pattern on the flattening layer described above and having the pattern in the channel part between the source electrode and the drain electrode on the gate insulating layer was irradiated with an eximer lamp (λ=172 nm) through a photomask of synthesized quart glass (made by ASAHI GLASS CO., LTD., trade name AQX). The photomask pattern at this time was 30 μm×300 μm.

<Step 1-16 (Application of Organic Semiconductor Layer)>

For the organic semiconductor layer, an organic semiconductor layer consisting of poly(3-hexylthiophene) having repeating units represented by the following Formula (5) was used. 0.5% chlorobenzene solution of poly(3-hexylthiophene) was coated with a method and was dried at 100° C. to form the organic semiconductor layer 6. Incidentally, as the source poly(3-hexylthiophene) powder, one obtained by refining a commercially available Aldrich Corporation product (Regio-regular type) by reprecipitation method was used.

(5)

Through the foregoing steps, the organic field effect transistor 1 was made.

A Vd-Id curve of the obtained FET was measured with a parameter analyzer (made by Agilent Technologies, 4156C (trade name)), showing such switching characteristic that the drain current value (Id) flowing through the source electrode/organic semiconductor/drain electrode changed in accordance with a change in the gate voltage (Vg). The carrier mobility of this organic field effect transistor 1 was $1.0 \times 10^{-2}$ cm$^2$/Vs and the ON/OFF ratio was 700.

At this time, the mobility and the ON/OFF ratio were calculated using the following equation (I).

$$I_{ds} = (WC_i/2L)\mu(V_G - V_0)^2 \qquad (I)$$

Here, W is a channel width (cm), L is a channel length (cm), $C_i$ is a capacitance of a gate insulating layer (F/cm$^2$)

(per unit area). From the relationship between a square root of the drain-source ($I_{ds}$) current (A) in a saturation region and the gate voltage ($V_G$) (V), extrapolation from the measured value to $I_{ds}$=0 determines the apparent threshold value voltage ($V_0$). The $I_{ds}$ in the saturation region is determined by observing the relationship between the drain-source voltage ($V_{ds}$) at a given $V_G$ and the drain-source current. The $I_{ds}$ in the saturation region is the $I_{ds}$ when $I_{ds}$ no longer increases even when the drain-source voltage is increased. The $I_{ds}$ in the saturation region changes with the change in $V_G$. Determination of this $V_0$ is implemented with known methods.

In addition, the ON/Off ratio is a ratio of the drain current flowing in the saturation state when the gate voltage ($V_G$) is not less than the drain voltage ($V_D$) to the drain current flowing when $V_G$ is 0.

Example 24

Step 1-2 to Step 1-14 are the same as those of Example 23. An organic field effect transistor was prepared which used the resin base material 6 and had the interface treatment layer. In addition, the material of the organic semiconductor layer was different from that of Example 23.

<Step 2-1 (Application of Flattening Layer)>

The organic resin solution 6 was coated on the resin base material 6 with a dip coater, and thereafter was heated in a hot-air circulating oven at 180° C. for an hour.

No cracks and the like were observed on the formed organic resin layer surface with visual observation. The water contact angle of the substrate surface was measured with an automatic dynamic contact angle meter DCA-WZ (made by Kyowa Interface Science Co., LTD.) and was 63°. The surface shape of the substrate obtained similarly as the resin base material 5 was observed to see that the average surface roughness (Ra') of this substrate was 0.3 nm and the maximum peak height was 3 nm.

<Step 2-15 (Interface Treatment Layer Latent Image Forming Step)>

The resin substrate having the gate electrode pattern, gate insulating layer and the source electrode and the drain electrode pattern on the flattening layer and having the source electrode and the drain electrode pattern on the gate insulating layer was irradiated with an eximer lamp (λ=172 nm) through a photomask of synthesized quart glass (made by ASAHI GLASS CO., LTD., trade name AQX). The photomask pattern at this time was 30 μm×280 μm.

<Step 2-16 (Interface Treatment Layer Forming Step)>

The resin solution 11 was coated by dipping on the resin substrate having a part of the gate insulating film subjected to the surface modification, and thereafter was heated in a hot-air circulating oven at 180° C. for 45 minutes. The shape of this interface treatment layer pattern was observed with an optical microscope, and was 30 μm×282 μm.

<Step 2-17 (Organic Semiconductor Layer Forming Step)>

An organic semiconductor layer was formed by dipping on the resin substrate having the gate electrode pattern, gate insulating layer and the source electrode and the drain electrode pattern on the flattening layer having the interface treatment layer formed in the channel part and having the source electrode and the drain electrode pattern on the gate insulating layer. The organic semiconductor used at this time was a 0.5% solution of tetrabicycloporyphyrin copper complex represented by with the following formula (6) in chloroform/acetone, which was coated by dipping, and calcination was effected at 220° C. to form a film of tetrabenzoporphyrin cooper complex represented by the formula (7). Through the foregoing steps, the organic field effect transistor 2 was obtained. This organic field effect transistor 2 had a mobility of 1.0 cm²/V·S and an ON/OFF ratio of 1,000. The mobility and the ON/OFF ratio were calculated by use of the method described in Example 23.

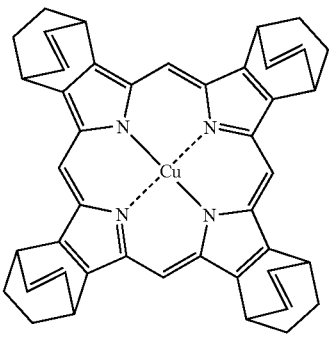

(6)

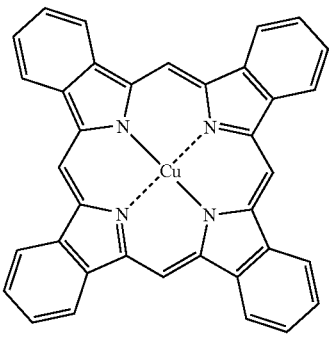

(7)

Example 25

The organic field effect transistor 3 was prepared following the same procedure as in Example 24 with the exception that an ink jet method was used in the step of forming the source electrode and the drain electrode (Step 1-12) and in the latent image forming step, the same photomask as in Step 1-11 was used. At this time, the line width of the source electrode and the drain electrode was 21 μm and the interval of the source electrode and the drain electrode was 19 μm. As for the subsequent steps, the same steps as in Example 23 were applied to obtain the organic field effect transistor 3. This organic field effect transistor 3 had a mobility (μ) of 1.1 cm²/V·S and an ON/OFF ratio of 1000. The mobility and the ON/OFF ratio were calculated using the method as in Example 22.

Comparative Example 7

Step 1-1 to Step 1-10 are the same steps as those of Example 23. In Step 1-11, UV irradiation time was set to 60 s. At this time, the water contact angle of the gate insulation layer was 45°. Thereafter, formation of the source electrode and the drain electrode was effected by the same method as in Step 1-12. However, the source electrode and the drain electrode on the gate insulating layer suffered from disconnection, so that the formation could not be attained.

Comparative Example 8

As in Step 1-1 of Example 23, the flattening layer was applied. However, the thickness of the flattening layer was 1.5 µ. The average surface roughness (Ra') of this flattening layer was 3 nm and the maximum height was 20 nm. The subsequent steps were the same as in Example 23. At this time, since the source electrode and the drain electrode formed in Step 1-11 had a part that failed to cover the protuberances of the resin substrate, the source electrode and the drain electrode were connected.

Example 26

By following the same fine structure forming method as in Example 13, an organic silver compound (made by FUJIKURAKASEI CO., LTD., DOTITE) was coated on the substrate 7 by dipping, and was heated in a hot-air circulating oven at 180° C. for 30 minutes to form a fine structure. However, in the hydrophobic organic layer, the water contact angle of the hydrophilic portion was 23° and the water contact angle of the hydrophobic portion was 118°, and this fine structure had a line width of 52 µm and a line interval of 48 µm.

Example 27

By following the same fine structure forming method as in Example 13, an organic silver compound (made by FUJIKURAKASEI CO., LTD., DOTITE) was coated on the substrate 8 by dipping, and was heated in a hot-air circulating oven at 180° C. for 30 minutes to form a fine structure. However, in the hydrophobic organic layer, the water contact angle of the hydrophilic portion was 24° and the water contact angle of the hydrophobic portion was 117°, and this fine structure had a line width of 53 µm and a line interval of 47 µm.

Example 28

An organic field effect transistor was made following the same procedure as in Example 24 with the exception that the resin solution 10 was used to form the gate insulating layer. In addition, since this gate insulating layer had an effect of an interface treatment layer, it was not necessary to apply the interface treatment layer.

Incidentally, steps different from those in Example 24 are as follows.

<Step 4-8 (Gate Insulating Layer Forming Step)>

The resin solution 10 was coated by dipping on the resin substrate 6 having a part of the flattening layer and the gate electrode subjected to the surface modification, and thereafter was heated in a hot-air circulating oven at 200° C. for 30 minutes.

<Step 4-9 (Hydrophobic Organic Layer Removal)>

The entire surface of the resin substrate having the gate electrode pattern and the gate insulating layer pattern on the flattening layer was subjected to 120-second irradiation with an eximer lamp ($\lambda$=172 nm). At this time, the water contact angle of the flattening layer was 66° and the water contact angle of the gate insulating layer was 40°.

<Step 4-10 (Application of Hydrophobic Organic Layer)>

A fluororesin (made by DAIKIN INDUSTRIES, Ltd., trade name Unidyne TG-656) was coated with a dip coater on the resin substrate 2 having the gate electrode pattern and the gate insulating layer pattern on the flattening layer, and thereafter was heated in a hot-air circulating oven at 80° C. for 15 minutes. At this time, the water contact angle of the flattening layer was 116° and the water contact angle of the gate insulating layer was 118°.

<Step 4-11 (Source Electrode and Drain Electrode Layer Latent Image Forming Step)>

The resin substrate having the gate electrode pattern and the gate insulating layer pattern on the flattening layer coated with the hydrophobic organic layer was irradiated with an eximer lamp ($\lambda$=172 nm) through a photomask of syntetic quart glass (made by ASAHI GLASS CO., LTD., trade name AQX). At this time, the photomask pattern of the source electrode and the drain electrode had a line width of 20 µm and a line interval of 20 µm. In addition, the water contact angle of the gate insulating layer was 20°.

<Step 4-12 (Source Electrode and Drain Electrode Forming Step)>

An organic silver compound (made by FUJIKURAKASEI CO., LTD., DOTITE) was coated by dipping on the resin substrate having a part of the flattening layer and a part of the gate insulating film subjected to the surface modification, and thereafter was heated in a hot-air circulating oven at 180° C. for 45 minutes. The shape of these source electrode and drain electrode were observed with an optical microscope, with the result that the line width was 22 µm and the line interval was 18 µm.

Thereafter, as with Example 24, the channel part was coated with a 0.5% solution of tetrabicycloporphyrin copper complex represented by the formula (6) in chloroform/acetone by dispense coating, and calcination was effected at 220° C. to form a film of tetrabenzoporphyrin copper complex represented by formula (7). Through the foregoing steps, the organic field effect transistor 2 was obtained. This organic field effect transistor 2 had a mobility ($\mu$) of 1.1 cm$^2$/V·S and a ON/OFF ratio of 900. The mobility and ON/OFF ratio were calculated by the method as in Example 23.

With the substrate of the present invention, even on a base material having much unevenness on its surface such as a resin base material, by forming an organic resin layer which has high smoothness and flatness and the water contact angle of surface of which can be changed by an outside stimulation, it is possible to form a sufficiently low resistance conductive layer even by use of a dispersion liquid or paste of conductive fine particles, so that substrates and conductive substrates used for making fine elements such as semiconductor devices, integrated circuits, image display devices can be produced by utilization thereof.

Further, in the organic field effect transistor of the present invention, on a base material including one having much unevenness on its surface such as a resin base material, an organic resin layer is provided which has high smoothness and flatness and the water contact angle of surface of which can be changed by an outside stimulation, and a gate insulating layer is also provided the water contact angle of surface of which can be changed by an outside stimulation such as light. Accordingly, a dispersion liquid or paste of conductive fine particles can be used to form a fine, low-resistance conductive layer. Moreover, this enables an organic semiconductor or gate electrode to be formed by application. Accordingly, an organic field effect transistor can be manufactured by a simple method at low cost. These characteristics enable usage as transistors for semiconductor elements, integrated circuits and image display devices.

This application claims priorities from Japanese Patent Application Nos. 2004-069082 filed on Mar. 11, 2004, 2004-

069083 filed on Mar. 11, 2004, and 2005-064562 filed on Mar. 8, 2005, which are hereby incorporated by reference herein.

What is claimed is:

1. A method of manufacturing an organic field effect transistor comprising a resin substrate, a gate electrode, a gate insulating layer, a source electrode, a drain electrode, and an organic semiconductor layer, the method comprising the steps of:

forming by application on at least a resin substrate, an organic resin layer having an average surface roughness of 1 nm or less and a maximum peak height of a surface unevenness of 30 nm or less;

forming a first hydrophobic organic layer by application on the organic resin layer;

subjecting the first hydrophobic organic layer to such a treatment as to form a first region in a surface of the first hydrophobic organic layer or a surface of the organic resin layer and to also form a second region in the surface of the first hydrophobic organic layer, the first and the second regions having different surface free energies;

forming a gate electrode on only either one of the first and the second regions;

removing the first hydrophobic organic layer from one of the first and second regions on which the gate electrode is not formed;

forming a gate insulating layer by application on the gate electrode;

after the step of forming the gate insulating layer, forming a second hydrophobic organic layer by application on a surface of the gate insulating layer and a surface of the organic resin layer;

subjecting the second hydrophobic organic layer to such a treatment as to form, in a surface of the second hydrophobic organic layer or the surface of the organic resin layer, a third region and a fourth region having different surface free energies, and simultaneously to form, in the surface of the gate insulating layer, a fifth region and a sixth region having different surface free energies, one of the fifth and the sixth regions having a water droplet contact angle of 90° or more and 130° or less and the other of the fifth and the sixth regions having a water droplet contact angle of 20° or more and 40° or less;

forming a source electrode and a drain electrode simultaneously by application on only either one of the third and fifth regions and the fourth and sixth regions; and forming an organic semiconductor layer by application on the gate insulating layer between the source electrode and the drain electrode.

2. The method of manufacturing an organic field affect transistor according to claim 1, wherein the surface free energy of the first region is made higher than the surface free energy of the second region.

3. The method of manufacturing an organic field effect transistor according to claim 1, wherein the gate electrode is formed in the first region.

4. The method of manufacturing an organic field effect transistor according to claim 1, wherein the surface free energy of the third region is made higher than the surface free energy of the fourth region and the surface free energy of the fifth region is made higher than the surface free energy of the sixth region.

5. The method of manufacturing an organic field effect transistor according to claim 1, wherein the source electrode and the drain electrode are formed in the third region.

6. The method of manufacturing an organic field effect transistor according to any one of claims 1 to 3, 4 and 5, wherein the first region has a water droplet contact angle of not less than 20° but no more than 50°; the second region has a water droplet contact angle of not less than 90° but no more than 130°; and the first region and the second region differ from each other in water droplet contact angle by 60° to 110°.

7. The method of manufacturing an organic field effect transistor according to any one of claims 1 to 3, 4 and 5, wherein the first hydrophobic organic layer comprises a polymeric material containing at least a fluoroalkyl group.

8. The method of manufacturing an organic field effect transistor according to any one of claims 1 to 3, 4 and 5, wherein the organic resin layer comprises a phenolic resin.

9. The method of manufacturing an organic field effect transistor according to any one of claims 1 to 3, 4 and 5, wherein the gate insulating layer comprises an insulating material selected from phenolic resins and silsesquioxane.

* * * * *